(12) United States Patent
Marowsky et al.

(10) Patent No.: US 10,439,329 B2
(45) Date of Patent: Oct. 8, 2019

(54) MODULAR CONNECTOR PLUG FOR HIGH SPEED DATA TRANSMISSION NETWORKS

(71) Applicant: Bel Fuse (Macao Commercial Offshore) Limited, Andar H-J (MO)

(72) Inventors: Richard D. Marowsky, Glen Rock, PA (US); Yakov Belopolsky, Glen Rock, PA (US); David H. Gutter, Glen Rock, PA (US)

(73) Assignee: Bel Fuse (Macao Commercial Offshore) Limited, Macau ( * ) Notice: Subject to any disclaimer, the term of this patent is extended or adjusted under 35 U.S.C. 154(b) by 0 days.

(21) Appl. No.: 15/786,795

(22) Filed: Oct. 18, 2017

(65) Prior Publication Data

US 2018/0040987 A1  Feb. 8, 2018

Related U.S. Application Data

(63) Continuation of application No. PCT/US2016/043334, filed on Jul. 21, 2016.
(Continued)

(51) Int. Cl.
*H01R 13/6466* (2011.01)
*H01R 13/6463* (2011.01)
(Continued)

(52) U.S. Cl.
CPC ..... *H01R 13/6466* (2013.01); *H01R 13/6463* (2013.01); *H01R 13/665* (2013.01);
(Continued)

(58) Field of Classification Search
CPC ............ H01R 13/6464; H01R 13/6466; H01R 24/64; H01R 24/60
(Continued)

(56) References Cited

U.S. PATENT DOCUMENTS 4,508,410 A  4/1985  Canham
5,975,960 A  11/1999  Fogg et al.
(Continued)

FOREIGN PATENT DOCUMENTS

EP   2765656 A1   8/2014
WO   2006081423 A1   8/2006

OTHER PUBLICATIONS

European Patent Office, International Search Report for International Application No. PCTUS2016/043334, dated Nov. 21, 2016.

*Primary Examiner* — Hien D Vu
(74) *Attorney, Agent, or Firm* — Patterson Intellectual Property Law, P.C.; Gary L. Montle

(57) ABSTRACT

A modular connector plug includes controlled capacitances to compensate for near end cross talk at the connector interface created by interaction of signals having signal frequencies in a data transmission bandwidth. A printed circuit board (PCB) is configured to receive cable pairs, and a connector assembly includes first and fourth plug contacts corresponding to the first cable pair and second and third plug contacts corresponding to the second cable pair. First ends of each contact are connected to the PCB, and second ends extend in parallel with each other and transversely to the PCB length, collectively defining a contact interface proximate the contact end. Each contact has a maximum width at the contact interface, with at least one plug contact having a maximum width greater than the maximum width of another plug contact. Each contact accordingly defines an electrode of a compensating capacitance formed between adjacent pairs of plug contacts.

10 Claims, 43 Drawing Sheets

Related U.S. Application Data

(60) Provisional application No. 62/195,062, filed on Jul. 21, 2015.

(51) Int. Cl.
*H01R 24/28* (2011.01)
*H01R 24/64* (2011.01)
*H05K 1/02* (2006.01)
*H01R 13/66* (2006.01)
*H05K 1/11* (2006.01)

(52) U.S. Cl.
CPC ............ *H01R 24/28* (2013.01); *H01R 24/64* (2013.01); *H05K 1/0228* (2013.01); *H05K 1/0245* (2013.01); *H05K 1/117* (2013.01); *H05K 2201/09063* (2013.01); *H05K 2201/10295* (2013.01); *H05K 2201/10356* (2013.01)

(58) Field of Classification Search
USPC ........................................ 439/676, 660, 951
See application file for complete search history.

(56) References Cited

U.S. PATENT DOCUMENTS

| | | | |
|---|---|---|---|
| 6,231,397 B1 | 5/2001 | de la Borbolla et al. | |
| 6,572,414 B2 * | 6/2003 | Ahn | H01R 13/6467 439/676 |
| 6,877,222 B2 | 4/2005 | Patel | |
| 6,964,587 B2 | 11/2005 | Colantuono et al. | |
| 7,038,554 B2 | 5/2006 | Seefried | |
| 7,048,590 B2 | 5/2006 | Colantuono et al. | |
| 7,153,168 B2 | 12/2006 | Caveney et al. | |
| 7,179,131 B2 | 2/2007 | Caveney et al. | |
| 7,190,594 B2 | 3/2007 | Hashim et al. | |
| 7,485,010 B2 * | 2/2009 | Aekins | H01R 13/41 439/620.13 |
| 7,604,515 B2 | 10/2009 | Siemon et al. | |
| 7,658,648 B2 | 2/2010 | Aekins | |
| 7,980,899 B2 | 7/2011 | Siemon et al. | |
| 8,033,863 B2 | 10/2011 | Gutter et al. | |
| 8,077,004 B2 | 12/2011 | Buckmeier et al. | |
| 8,128,432 B2 | 3/2012 | Jaouen et al. | |
| 8,395,329 B2 | 3/2013 | Jutras et al. | |
| 8,858,267 B2 | 10/2014 | Hashim et al. | |
| 8,858,268 B2 | 10/2014 | Hashim et al. | |
| 8,894,447 B2 | 11/2014 | Canning et al. | |
| 8,915,756 B2 | 12/2014 | Schumacher et al. | |
| 8,920,199 B2 | 12/2014 | Schumacher et al. | |
| 8,968,035 B2 | 3/2015 | Hashim et al. | |
| 9,011,182 B2 | 4/2015 | Hashim et al. | |
| 9,054,460 B2 | 6/2015 | Schumacher et al. | |
| 9,112,320 B2 | 8/2015 | Hashim et al. | |
| 9,124,101 B2 | 9/2015 | Jutras et al. | |
| 9,209,569 B2 | 12/2015 | Schumacher | |
| 9,287,670 B2 | 3/2016 | Canning et al. | |
| 9,337,584 B2 | 5/2016 | Schumacher et al. | |
| 9,407,044 B2 | 8/2016 | Caveney et al. | |
| 2008/0160837 A1 | 7/2008 | Siemon et al. | |
| 2008/0254685 A1 | 10/2008 | Murr et al. | |
| 2009/0142968 A1 | 6/2009 | Goodrich et al. | |
| 2010/0003863 A1 | 1/2010 | Siemon et al. | |
| 2012/0076459 A1 | 3/2012 | Sell | |
| 2012/0100744 A1 | 4/2012 | Bolouri-Saransar et al. | |
| 2013/0210288 A1 * | 8/2013 | Schumacher | H01R 13/658 439/676 |
| 2013/0210289 A1 * | 8/2013 | Schumacher | H01R 12/53 439/676 |
| 2013/0225009 A1 | 8/2013 | Hashim et al. | |
| 2014/0203886 A1 | 7/2014 | Schumacher | |
| 2014/0206240 A1 | 7/2014 | Schumacher et al. | |
| 2014/0273624 A1 | 9/2014 | Hashim et al. | |
| 2014/0273629 A1 | 9/2014 | Canning et al. | |
| 2014/0273657 A1 * | 9/2014 | Hashim | H01B 11/04 439/676 |
| 2014/0377997 A1 | 12/2014 | Hashim et al. | |
| 2014/0378004 A1 | 12/2014 | Hashim et al. | |
| 2015/0044908 A1 | 2/2015 | Canning et al. | |
| 2015/0111432 A1 | 4/2015 | Schumacher et al. | |
| 2015/0194767 A1 | 7/2015 | Hashim et al. | |
| 2015/0244120 A1 | 8/2015 | Schumacher et al. | |
| 2016/0020567 A1 | 1/2016 | Belopolsky et al. | |
| 2016/0079710 A1 | 3/2016 | Schumacher | |
| 2016/0149361 A1 | 5/2016 | Canning et al. | |

* cited by examiner

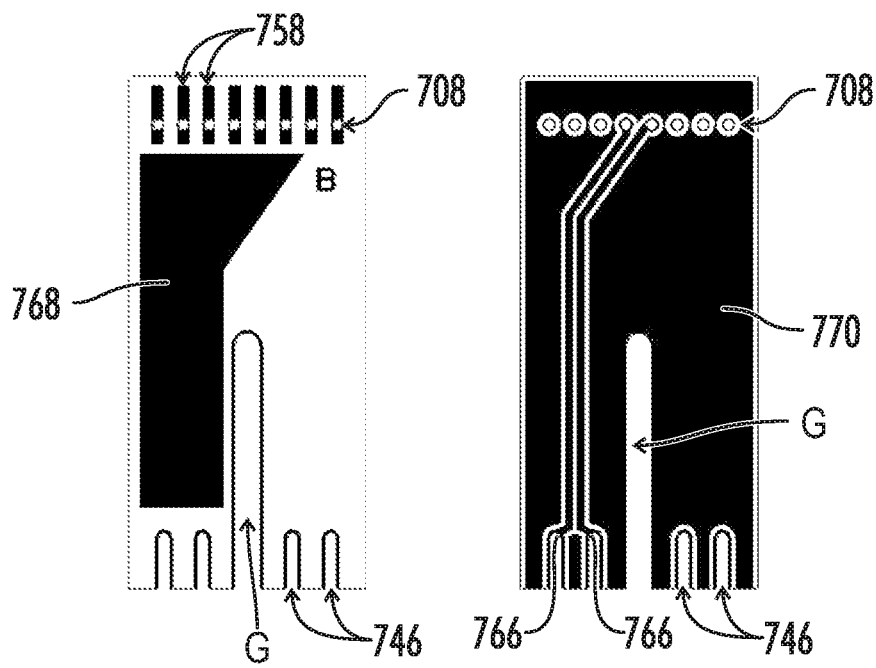
*FIG. 40*  *FIG. 41*
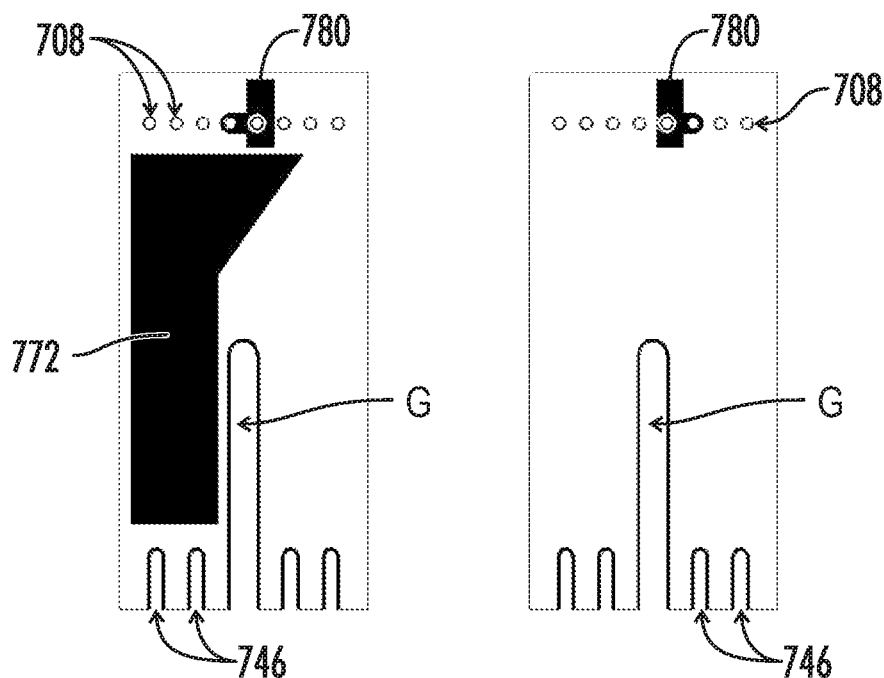
*FIG. 42*  *FIG. 43*

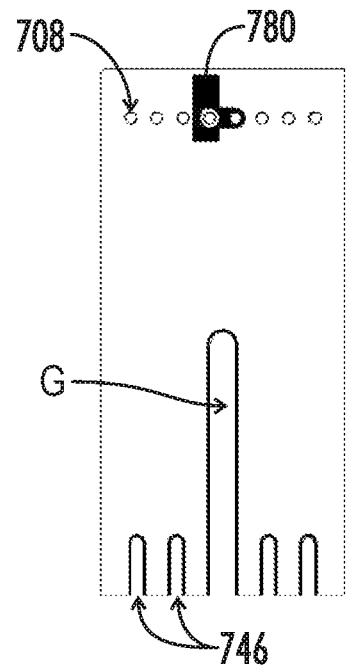
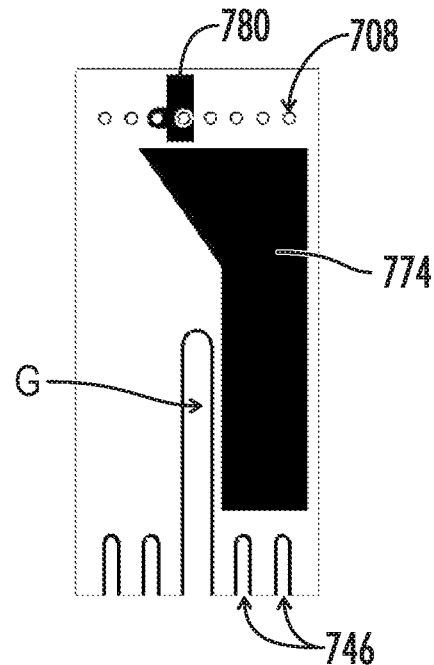
FIG. 44    FIG. 45
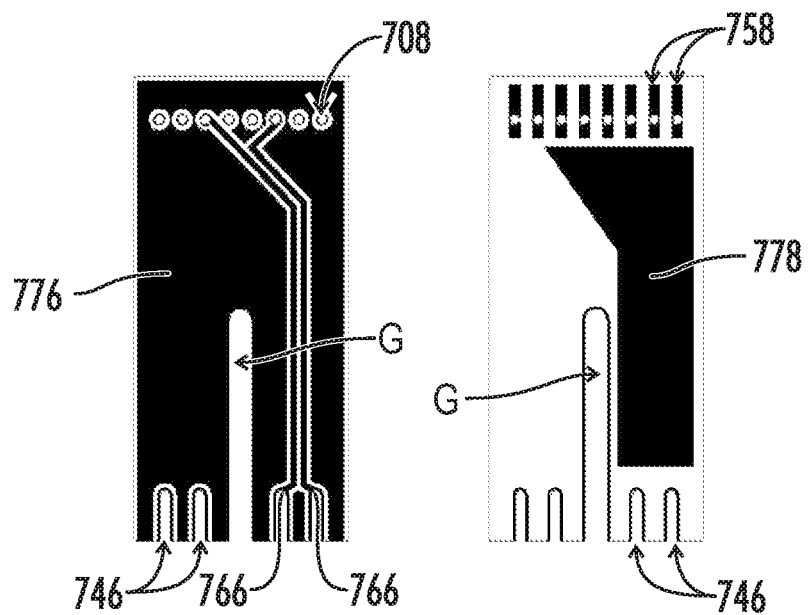
FIG. 46    FIG. 47

MODULAR CONNECTOR PLUG FOR HIGH SPEED DATA TRANSMISSION NETWORKS

CROSS-REFERENCES TO RELATED APPLICATIONS

This application is a continuation of International Patent Application No. PCT/US2016/043334, filed Jul. 21, 2016, and further claims priority of U.S. Provisional Patent Application No. 62/195,062, filed Jul. 21, 2015, and which is hereby incorporated by reference.

A portion of the disclosure of this patent document contains material that is subject to copyright protection. The copyright owner has no objection to the reproduction of the patent document or the patent disclosure, as it appears in the U.S. Patent and Trademark Office patent file or records, but otherwise reserves all copyright rights whatsoever.

BACKGROUND

The present invention relates generally to a modular plug for data transmission. More particularly, the present invention relates to a modular plug for high speed data transmission in support of multi-gigabit Ethernet protocols.

The use of modular plugs and jacks for data transmission is known. Plugs are attached to ends of an electrical cable connecting electronic devices such as switches or routers in data centers or computers in offices. The cables have multiple conductors, or wires. For Ethernet protocol connectivity, typically eight wires are used. While the cable is terminated by plugs, the electronic equipment must have jacks corresponding to the plugs. Plugs and jacks are designed to be able to mate to provide both mechanical and electrical coupling. International standards govern the mechanical dimensions of the plugs and jacks.

A common mechanical connector configuration known as RJ45 allows utilization of the existing networking equipment through a feature called auto-negotiation. During the auto-negotiation process, the connected devices assume master-slave relation and agree on the maximum speed for data to be transmitted. The jacks, cable, and plug must be able to support the Ethernet protocols and may affect the auto-negotiation. If any component is designed for the older Ethernet speeds, it will force the newer and faster networking equipment to run below its intended speed. All known modular plugs that work in a wide data transmission spectra (such as from 10 to 2000 MHz) cause some degradation of the signals.

Ethernet protocols divide the electromagnetic signals into four streams. These streams are transmitted over the same cable. Thus, with a mated connector pair, there are four streams or channels of signals operating simultaneously. The unwanted interaction of these signals is called near end cross talk (or NEXT). The NEXT must be minimized to allow substantially error-free transmission of data. The most common method of reducing NEXT is through compensation. Compensation can be provided by creating signals of similar amplitude but opposite polarity from the NEXT signals that are inherently present at the interface between the jack and the plug. A compensating reactance that is defined near the plug-jack interface can be used for this purpose.

Signal degradation at high frequencies is caused by one or more of several potentially mutually dependent issues. Introducing compensation far away from the interface may cause an unpredictable phase shift of electromagnetic signals traveling within the jack and plug connection. The plug contact blades have high intrinsic self-inductance and uncontrolled and relatively low capacitance between adjacent contacts. Known designs also do not allow for control of the interaction of the cable pairs within the plug. The distance between the cable terminations and the contacts is overly long in existing designs. Finally, most of the existing plug designs attempt to provide easy termination in the field at the expense of transmission performance.

BRIEF SUMMARY

An invention as disclosed herein addresses the issue of signal degradation at high frequencies by providing a controlled amount of capacitance in the immediate vicinity of the interface between a jack and a corresponding plug.

In one desirable aspect of a modular connector plug as disclosed herein, the design corresponds in relevant mechanical details, size and shape to the industry standard RJ45 plug, and further enables operation within a wide spectra, such as for example from 10 to 2000 MHz.

In another desirable aspect of the modular connector plug as disclosed herein, the phase shift and corresponding signal degradation are minimized.

In another aspect, the primary compensation is provided in the immediate vicinity of the connector interface.

In another aspect, essentially the same components may be used for field-terminable and factory-terminable plugs.

In various embodiments for achieving some or all of the aforementioned aspects, the plug contact blades are short and have very low intrinsic self-inductance, and there is high capacitance between adjacent contacts.

In various embodiments, the inductance between cable pairs or in-plug mutual inductance may be controlled through the use of an air gap within the printed circuit board (PCB). A connector plug as disclosed herein may further physically separate the cable pairs by moving two of the four pairs to an opposing side of the connector, and/or by bringing selected cable pairs to the front of the plug so as to keep signal disruption to a minimum.

In one exemplary embodiment, a modular connector plug as disclosed herein for forming a connector interface with a connector jack in a high speed data transmission network is provided with a printed circuit board (PCB) including a length defined from a contact end to a cable end opposite the contact end. At least first and second cable pairs are connected to the PCB. A connector assembly includes first and fourth plug contacts corresponding to the first cable pair and second and third plug contacts corresponding to the second cable pair. Each plug contact has a first end connected to the PCB proximate the contact end, and a second end. Each second end of the respective plug contacts extends in parallel with each other and in transverse orientation with respect to the PCB length, further collectively defining a contact interface proximate the contact end.

With respect to the aforementioned exemplary embodiment, a first compensating capacitance may be defined between the first and second plug contacts. A second compensating capacitance may be defined between the third and fourth plug contacts. The first and second compensating capacitances are provided proximate the contact interface. The first and second compensating capacitances are defined to compensate for near end cross talk at the connector interface created by interaction of signals having signal frequencies in a data transmission bandwidth.

Further with respect to this embodiment, the first and second compensating capacitances may be defined based on proximity of the plug contacts to the contact interface, and a corresponding reduction in phase shift.

Further with respect to this embodiment, the PCB may include a plurality of through holes configured to receive the respective first ends of the plug contacts. Each plug contact is further configured so that upon connecting the first end via a through hole of the PCB, the second end overhangs the contact end of the PCB.

Further with respect to this embodiment of a connector plug as disclosed herein, each first end of the respective plug contacts may extend in transverse orientation with respect to the PCB length and in parallel with the contact interface defined by the second ends. Each plug contact may further include a bridge portion between the respective first and second ends. Each plug contact may further be approximately staple-shaped, for example with each plug contact at least coincident with a lower plane of the PCB.

Further with respect to this embodiment of a connector plug as disclosed herein, each plug contact may have a maximum width extending in a direction perpendicular to the PCB length, with at least one plug contact having a maximum width greater than the maximum width of another plug contact. The at least one plug contact may include a protrusion extending from only one side of the plug contact in a direction towards an adjacent plug contact.

Further with respect to this embodiment of a connector plug as disclosed herein, the bridge portion for each plug contact may have a length extending from the first end to the second end, at least one plug contact having a bridge portion length shorter than the bridge portion length of another plug contact. The bridge portion lengths of the plug contacts may further alternate sequentially along a direction perpendicular to the circuit board length, and define a first plurality of plug contacts having their respective first ends connected in parallel along a direction perpendicular to the circuit board length, and a second plurality of plug contacts having their respective second ends connected in parallel along a direction perpendicular to the circuit board length.

Further with respect to this embodiment of a connector plug as disclosed herein, the PCB may be provided with a first plurality of vias configured to receive the respective first ends of the plug contacts, and a second plurality of vias located nearer the cable end than the contact end to receive at least one of the cable pairs. A plurality of conductor traces each electrically connects one of the first plurality of vias to a corresponding one of the second plurality of vias. An air gap extends a distance along the length of the circuit board and is located between two adjacent conductor traces. In one example wherein one of the cable pairs is coupled to the second plurality of vias, a third plurality of vias may be located nearer the contact end than the cable end to receive at least the other one of the cable pairs.

Further with respect to this embodiment of a connector plug as disclosed herein, the design may include an insulative plug body having an interior configured to laterally receive the PCB and an exposed face portion corresponding to the contact interface when the PCB is received therein. A conductive shield may be positioned corresponding with the air gap of the PCB when the PCB is received therein, the shield including a planar section extending in a direction perpendicular to the longitudinal axis of the air gap.

In another exemplary embodiment of a connector plug as disclosed herein, a connector assembly is coupled to a PCB, including first and fourth plug contacts corresponding to a first cable pair and second and third plug contacts corresponding to a second cable pair. Each plug contact has a first end connected to the PCB proximate the contact end, and a second end. Each second end of the respective plug contacts extends in parallel with each other and in transverse orientation with respect to the PCB length, further collectively defining a contact interface proximate the contact end. An insulative material at least partially covers the plug contacts, wherein a first compensating capacitance is defined proximate the contact interface by the insulative material as between the first and second plug contacts. A second compensating capacitance is defined by the insulative material between the third and fourth plug contacts. The first and second compensating capacitances are defined to compensate for near end cross talk at the connector interface created by interaction of signals having signal frequencies in a data transmission bandwidth.

In an embodiment, an insulative material at least partially covers plug contacts, wherein respective compensating capacitances are defined proximate the contact interface by the insulative material as between at least the first and second contacts, and the third and fourth contacts.

In another exemplary embodiment of a connector plug as disclosed herein, a PCB includes a plurality of contact holes defined therein and proximate a contact end. A plurality of contact blades each include a plug portion inserted in a respective contact hole and an insulation piercing protrusion opposite the plug portion. A first and fourth of the contact blades correspond to a first cable pair and a second and third of said contact blades corresponding to a second cable pair. The PCB further includes a first capacitor proximate the contact interface and between the first and second contact blades, and a second capacitor proximate the contact interface and between the third and fourth contact blades.

Further with respect to this embodiment of a connector plug as disclosed herein, each capacitor may include a first electrode disposed in the PCB. Each contact hole is a plated through hole in electrical connection with a respective first electrode. A second electrode is disposed in the PCB and in proximity with the associated first electrode so as to define a compensating capacitance for near end cross talk at the connector interface created by interaction of signals having signal frequencies in a data transmission bandwidth.

Further with respect to this embodiment of a connector plug as disclosed herein, the second electrode may be electrically connected to an adjacent contact hole.

Further with respect to this embodiment of a connector plug as disclosed herein, the first electrode may be a first annular electrode.

Further with respect to this embodiment of a connector plug as disclosed herein, the first and second capacitors may further respectively be first and second multilayer capacitors, each multilayer capacitor disposed within the PCB between respective adjacent contact holes.

Further with respect to this embodiment of a connector plug as disclosed herein, the plug portion of each contact blade may include a plug end configured to extend beyond a top surface of the PCB such that the plug end may come in contact with a corresponding female jack contact when the plug is inserted into a female jack connector.

Further with respect to this embodiment of a connector plug as disclosed herein, the plurality of contact holes may include through holes positioned in a row along the PCB. The plug portion of each contact blade may further extend through a respective through hole such that the plug end extends beyond a top surface of the PCB and the insulation piercing protrusion is disposed on an opposite side of the PCB.

Numerous objects, features, and advantages of the present invention will be readily apparent to those skilled in the art upon a reading of the following disclosure when taken in conjunction with the accompanying drawings.

BRIEF DESCRIPTION OF THE SEVERAL VIEWS OF THE DRAWINGS

FIG. 40 is a top copper layer of the first layer of the PCB of FIG. 38.

FIG. 41 is a bottom copper layer of the first layer of the PCB of FIG. 38.

FIG. 42 is a top copper layer of the second layer of the PCB of FIG. 38.

FIG. 43 is a bottom copper layer of the second layer of the PCB of FIG. 38.

FIG. 44 is a top copper layer of the third layer of the PCB of FIG. 38.

FIG. 45 is a bottom copper layer of the third layer of the PCB of FIG. 38.

FIG. 46 is a top copper layer of the fourth layer of the PCB of FIG. 38.

FIG. 47 is a bottom copper layer of the fourth layer of the PCB of FIG. 38.

DETAILED DESCRIPTION

Figure 1:
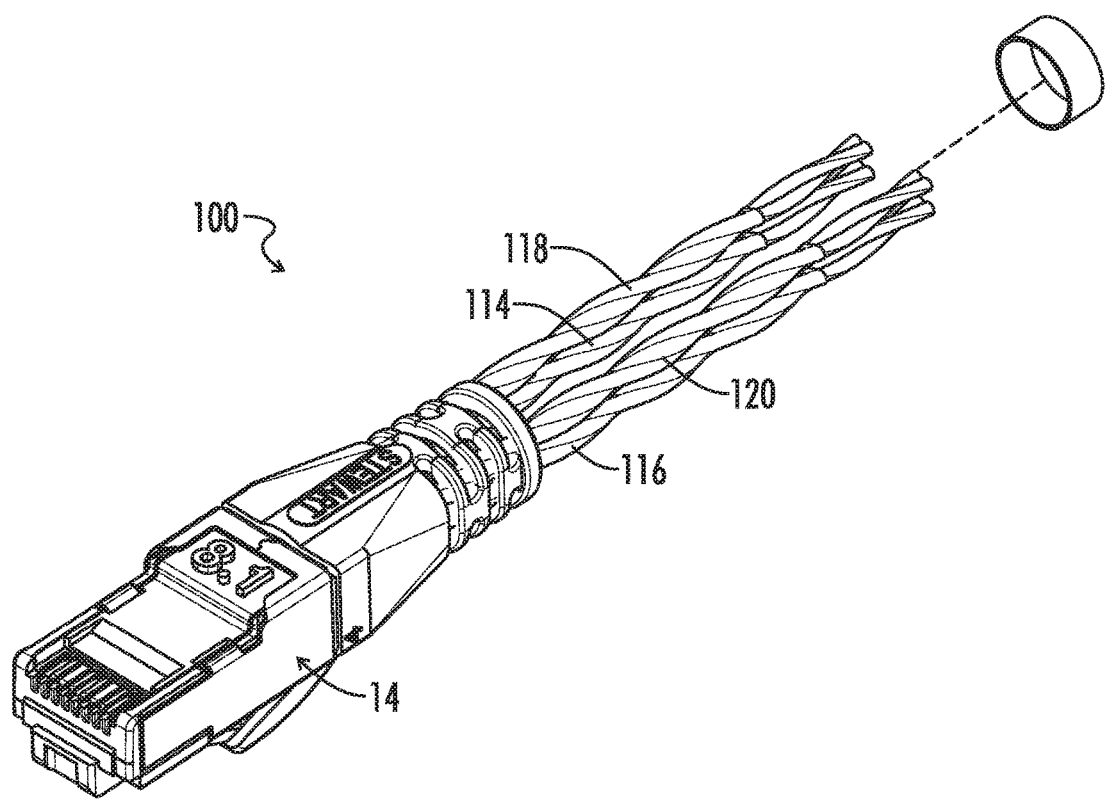
FIG. 1 is a perspective view of a first embodiment of a modular connector plug for data transmission.
Figure 2:
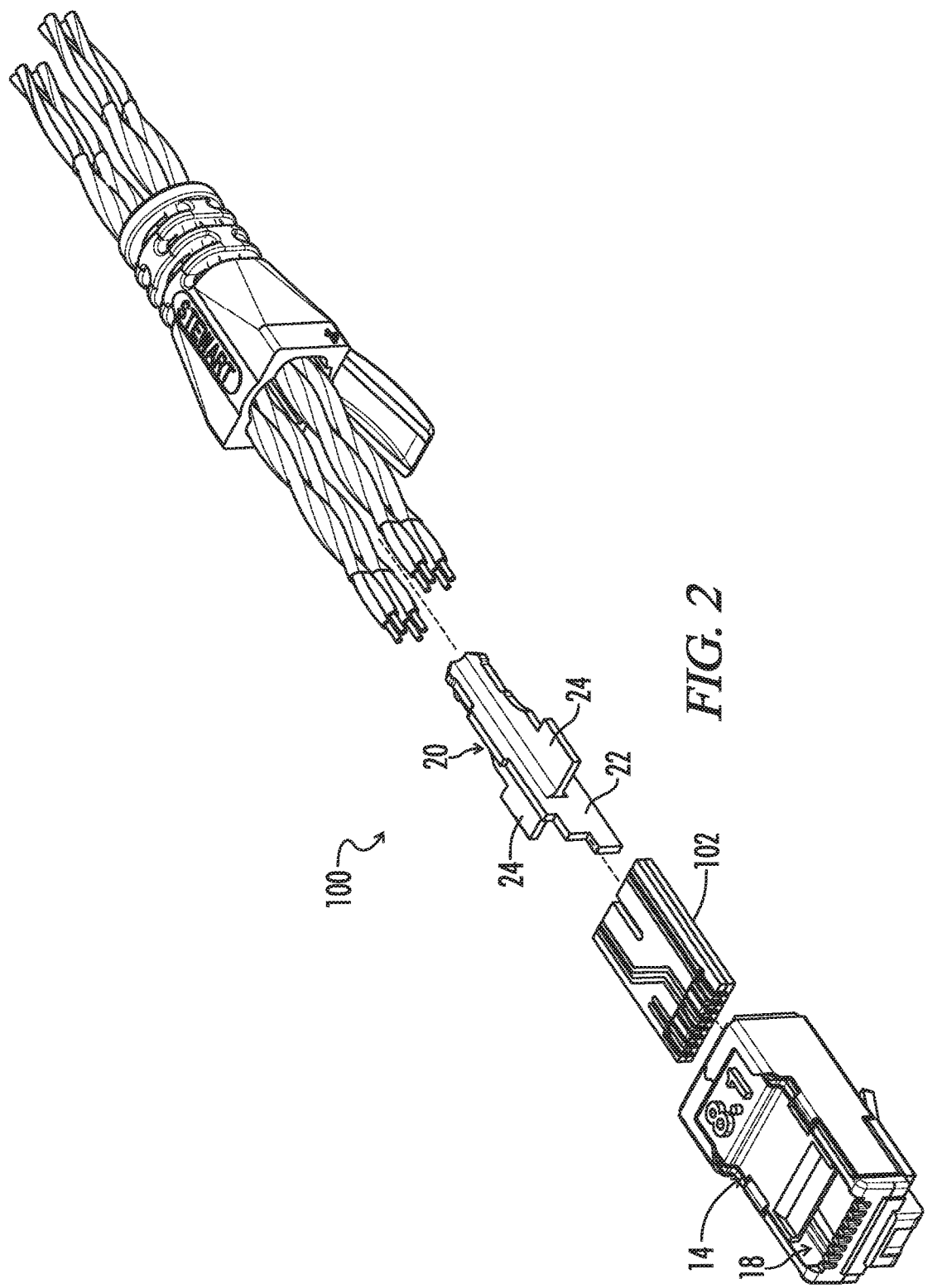
FIG. 2 is an exploded perspective view of the connector plug of FIG. 1.
Figure 3:
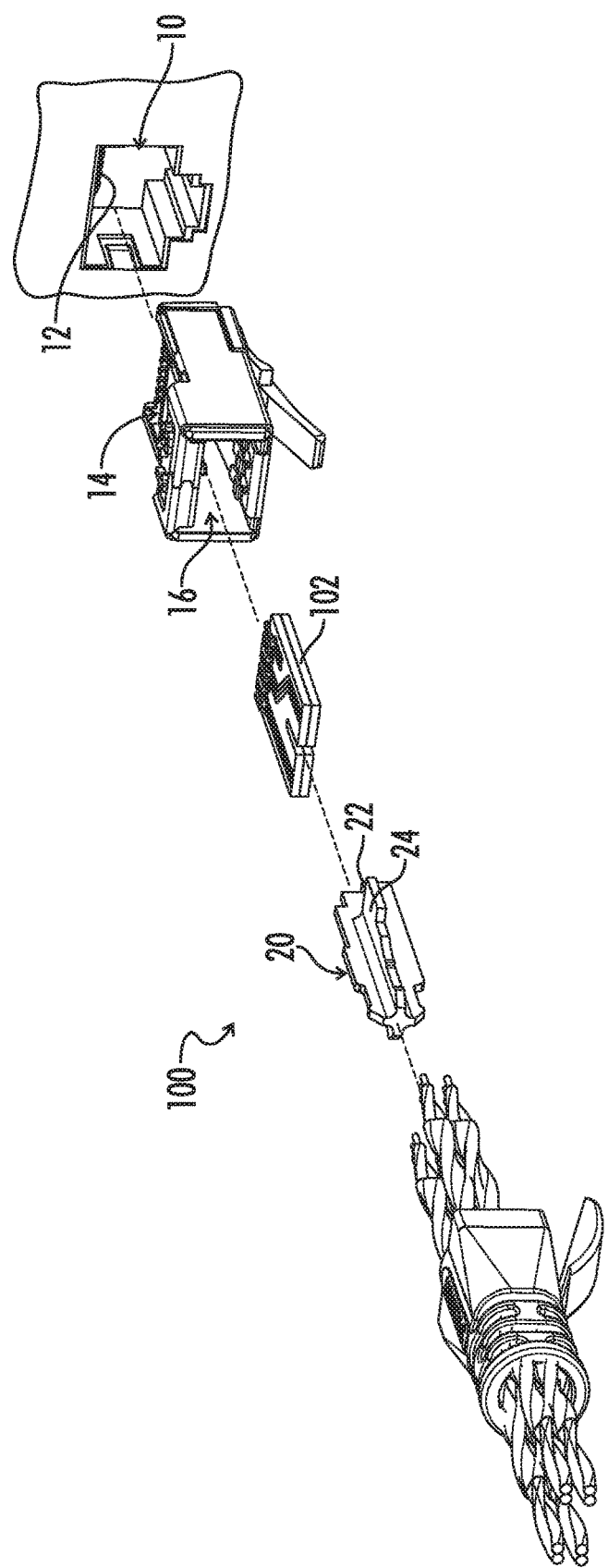
FIG. 3 is an exploded rear perspective view of the connector plug of FIG. 1 and a female connector jack.

Referring generally to FIGS. 1-12, a first exemplary embodiment of a modular connector plug 100 may be described herein. As shown in FIG. 3, the connector plug 100 forms a connector interface with a corresponding female connector jack 10 including a plurality of female jack contacts 12 in a high speed data transmission network. A printed circuit board (PCB) 102 has a length L (best seen in FIGS. 7 and 8) defined from a contact end 104 to a cable end 106 opposite the contact end. A plurality of contact holes 108 are defined in the PCB 102. The contact holes 108 may be through holes, or they may be vias defined in the PCB 102. The PCB 102 also includes a first surface (or top surface, further defining an upper plane) 110 and a second surface (or bottom surface, further defining a lower plane) 112 opposite the first surface.

Figure 4:
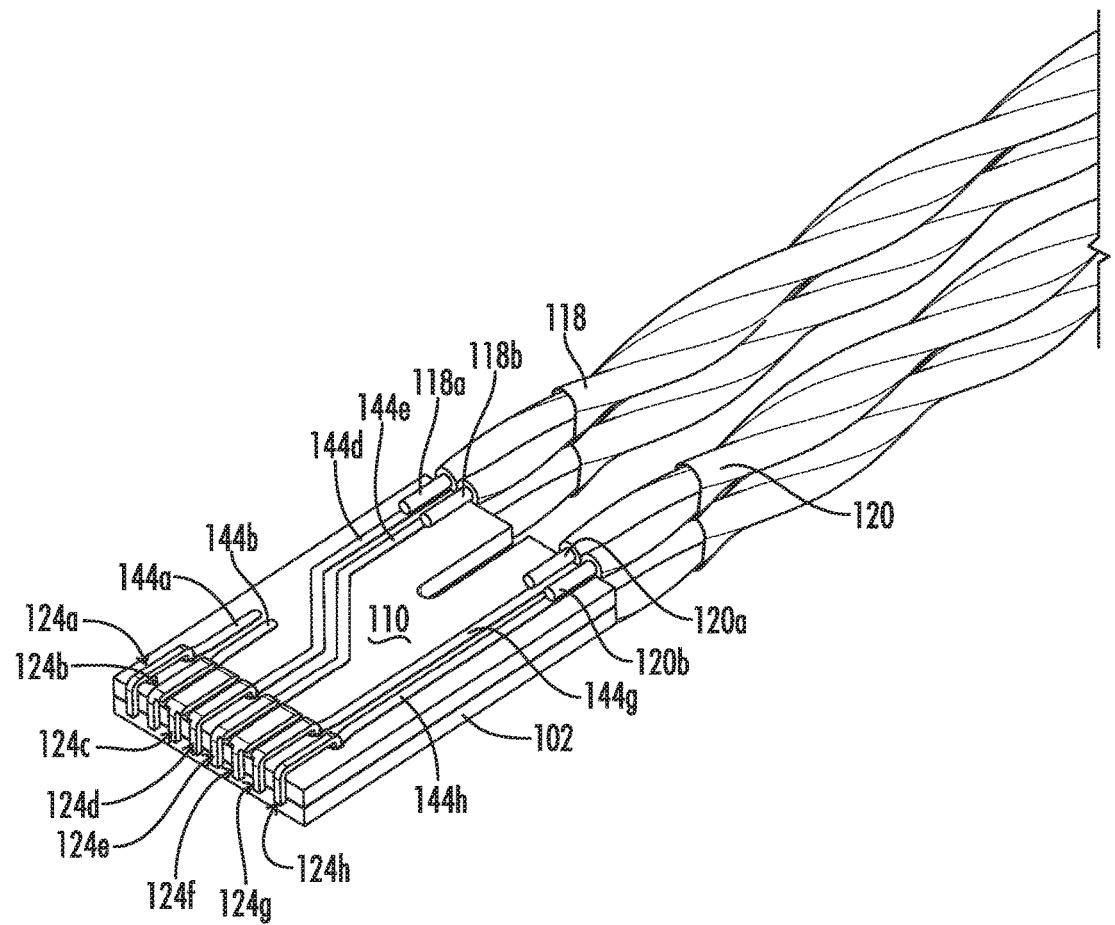
FIG. 4 is a detailed top perspective view of the PCB, plug contacts, and cable pairs of the connector plug of FIG. 1.
Figure 5:
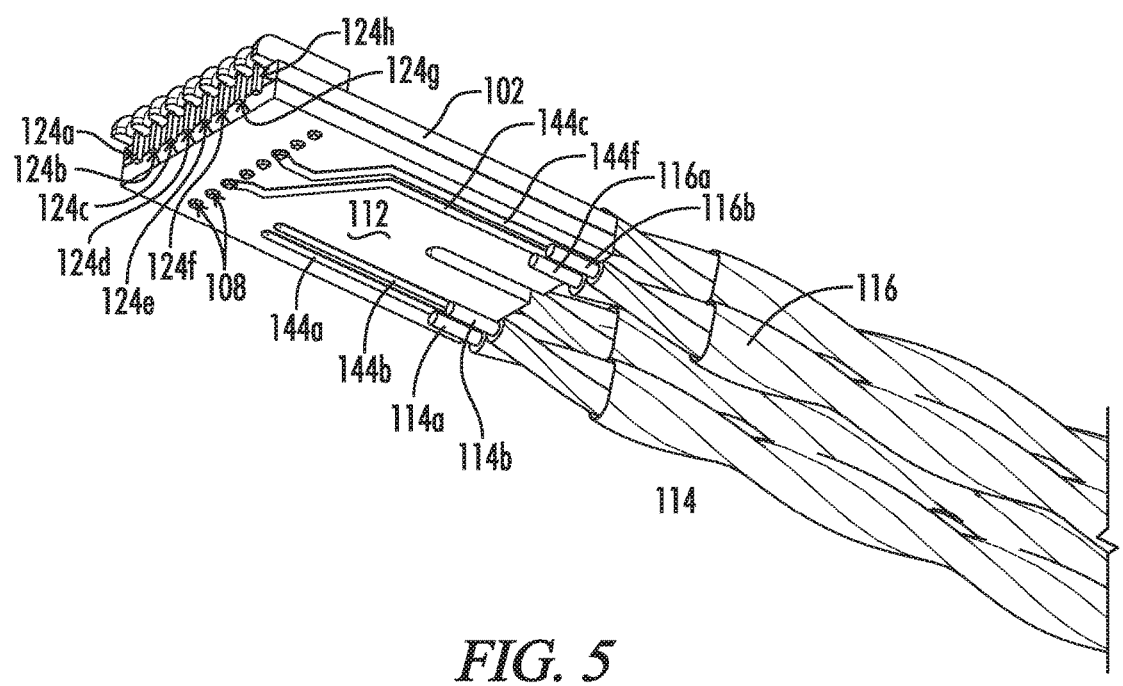
FIG. 5 is a detailed bottom perspective view of the components shown in FIG. 4.
Figure 6:
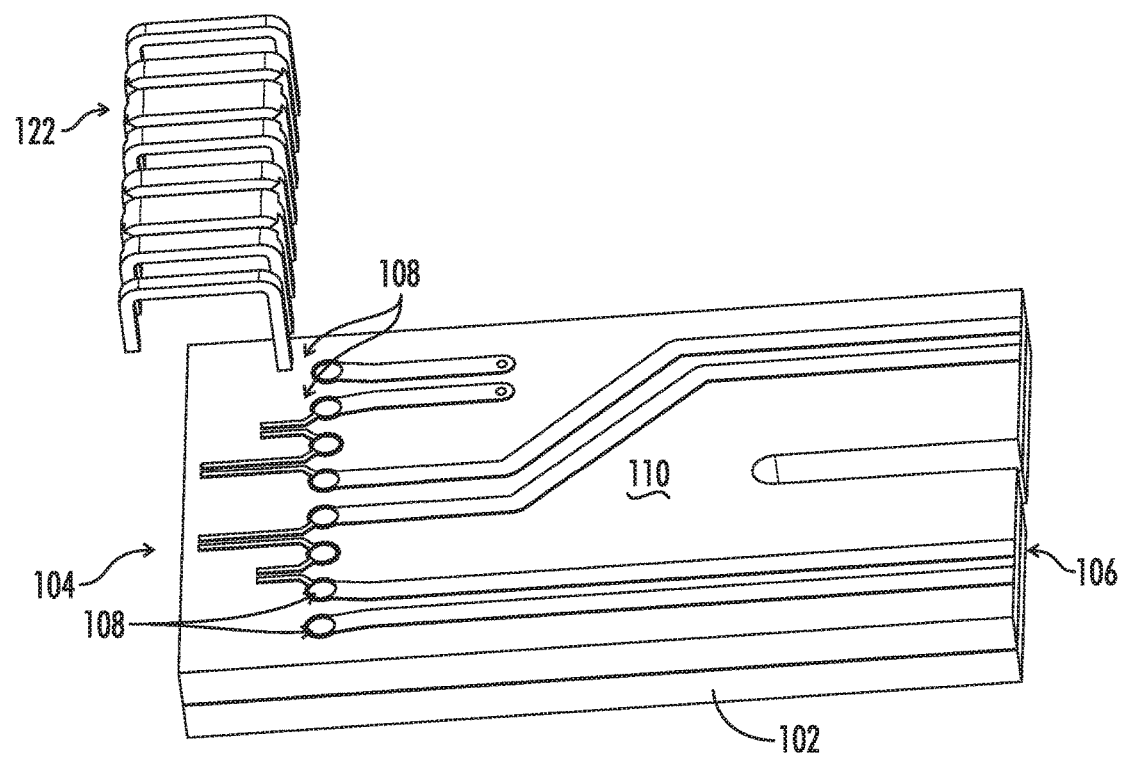
FIG. 6 is a detailed perspective view of the PCB with the plug contacts exploded therefrom of the connector plug of FIG. 1.

Turning now to FIGS. 4 and 5, the connector plug 100 also includes a first cable pair 114 including cables 114a, 114b; a second cable pair 116 including cables 116a, 116b; a third cable pair 118 including cables 118a, 118b; and a fourth cable pair 120 including cables 120a, 120b. The cable pairs 114, 116, 118, 120 are connected to the PCB 102, for example, by soldering the respective cables to vias in electrical connection with conductive tracks 144 disposed along one or more layers of the PCB as further described below.

As shown in FIGS. 6, 7, 10, and 12, a connector assembly 122 is disposed on the PCB 102. The connector assembly 122 includes a first plug contact 124a and a second plug contact 124b corresponding to the first cable pair 114, a third plug contact 124c and a sixth plug contact 124f corresponding to the second cable pair 116, a fourth plug contact 124d and a fifth plug contact 124e corresponding to the third cable pair 118, and a seventh plug contact 124g and an eighth plug contact 124h corresponding to the fourth cable pair 120. Stated another way, the first plug contact 124a corresponds to the cable 114a of the first cable pair 114, the second plug contact 124b corresponds to the cable 114b of the first cable pair, the third plug contact 124c corresponds to the cable 116a of the second cable pair 116, the fourth plug contact 124d corresponds to the cable 118a of the third cable pair 118, the fifth plug contact 124e corresponds to the cable 118b of the third cable pair, the sixth plug contact 124f corresponds to the cable 116b of the second cable pair, the seventh plug contact 124g corresponds to the cable 120a of the fourth cable pair 120, and the eighth plug contact 124h corresponds to the cable 120b of the fourth cable pair.

Figure 10:
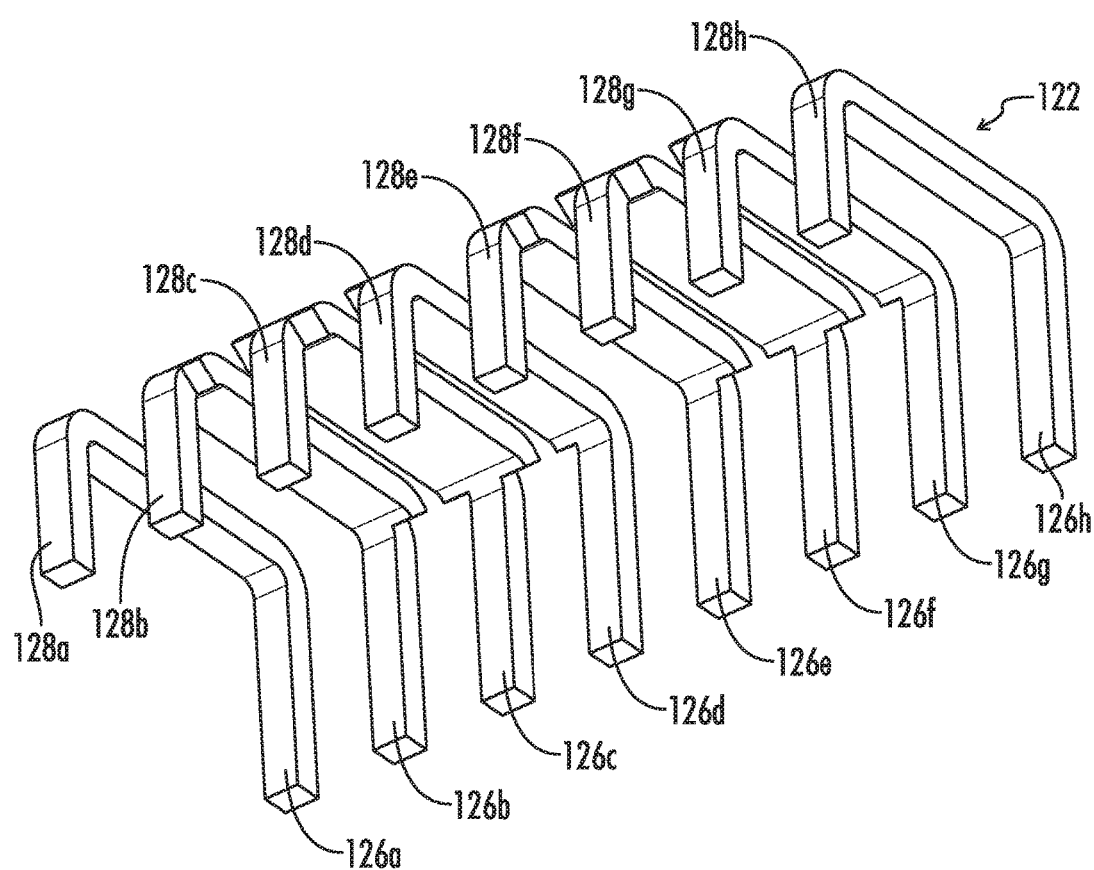
FIG. 10 is a bottom perspective view of the plug contacts of the connector plug of FIG. 1.
Figure 11:
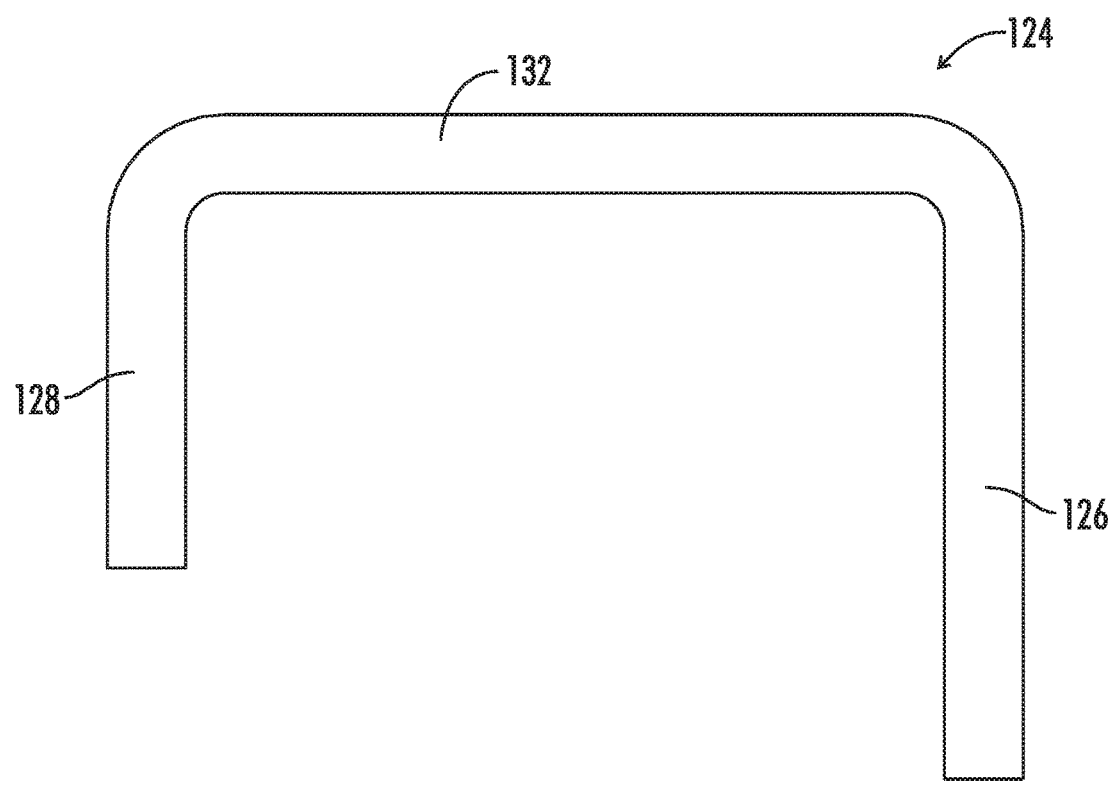
FIG. 11 is a side elevation view of the plug contacts of FIG. 10.

As best seen in FIGS. 10 and 11, each plug contact 124 includes a first end 126 connected to the PCB 102 proximate the contact end 104. For instance, the first plug contact 124a includes a first end 126a connected to the PCB 102 proximate the contact end 104. Each of the remaining plug contacts 124b-124h similarly includes a respective first end 126b-126h. Each respective contact hole 108 of the PCB 102 is configured to receive the first end 126 of a respective plug contact 124. The first end 126 of each respective plug contact 124 extends in transverse orientation with respect to the length L of the PCB 102. The first end 126 of each plug contact 124 may also be at least coincident with the lower plane 112 of the PCB 102.

Figure 7:
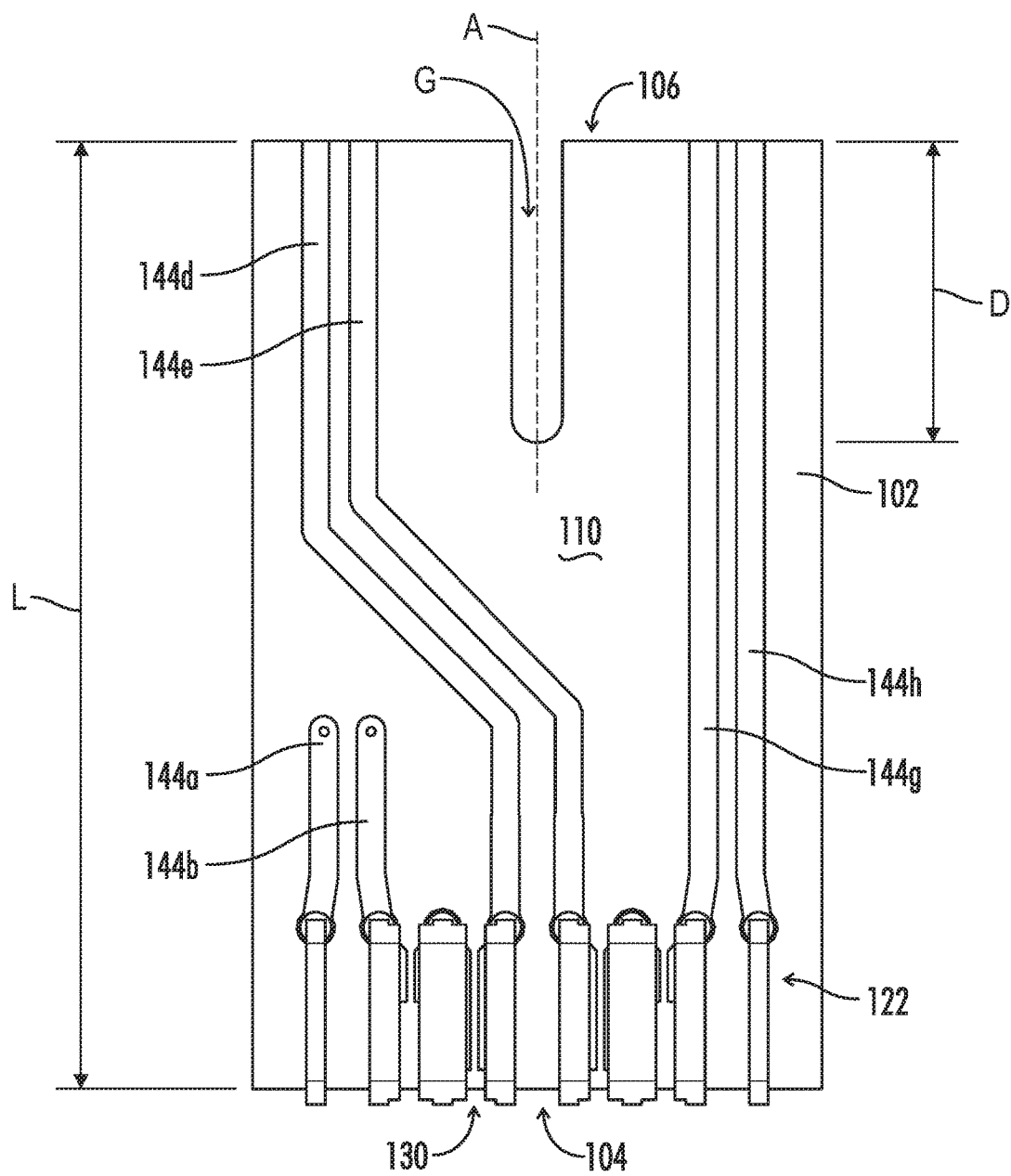
FIG. 7 is a top plan view of the PCB with plug contacts mounted thereto of the connector of FIG. 1.

Each plug contact 124 further includes a second end 128. For instance, the first plug contact 124a includes a second end 128a. Each of the remaining plug contacts 124b-124h similarly includes a respective second end 128b-128h. Each second end 128 of a plug contact 124 extends in parallel with the other respective second ends of the other plug contacts and in transverse orientation with respect to the length L of the PCB 102. As shown in FIG. 7, the second ends 128 further collectively define a contact interface 130 proximate the contact end 104 of the PCB 102.

In this configuration, when the first end 126 of each plug contact 124 is connected to the PCB 102 at a respective contact hole 108, the second end 128 of each plug contact overhangs the contact end 104 of the PCB. The contact interface 130 defined by the second ends 128 also extends in parallel with the first ends 126 of the plug contacts 124.

Figure 12:
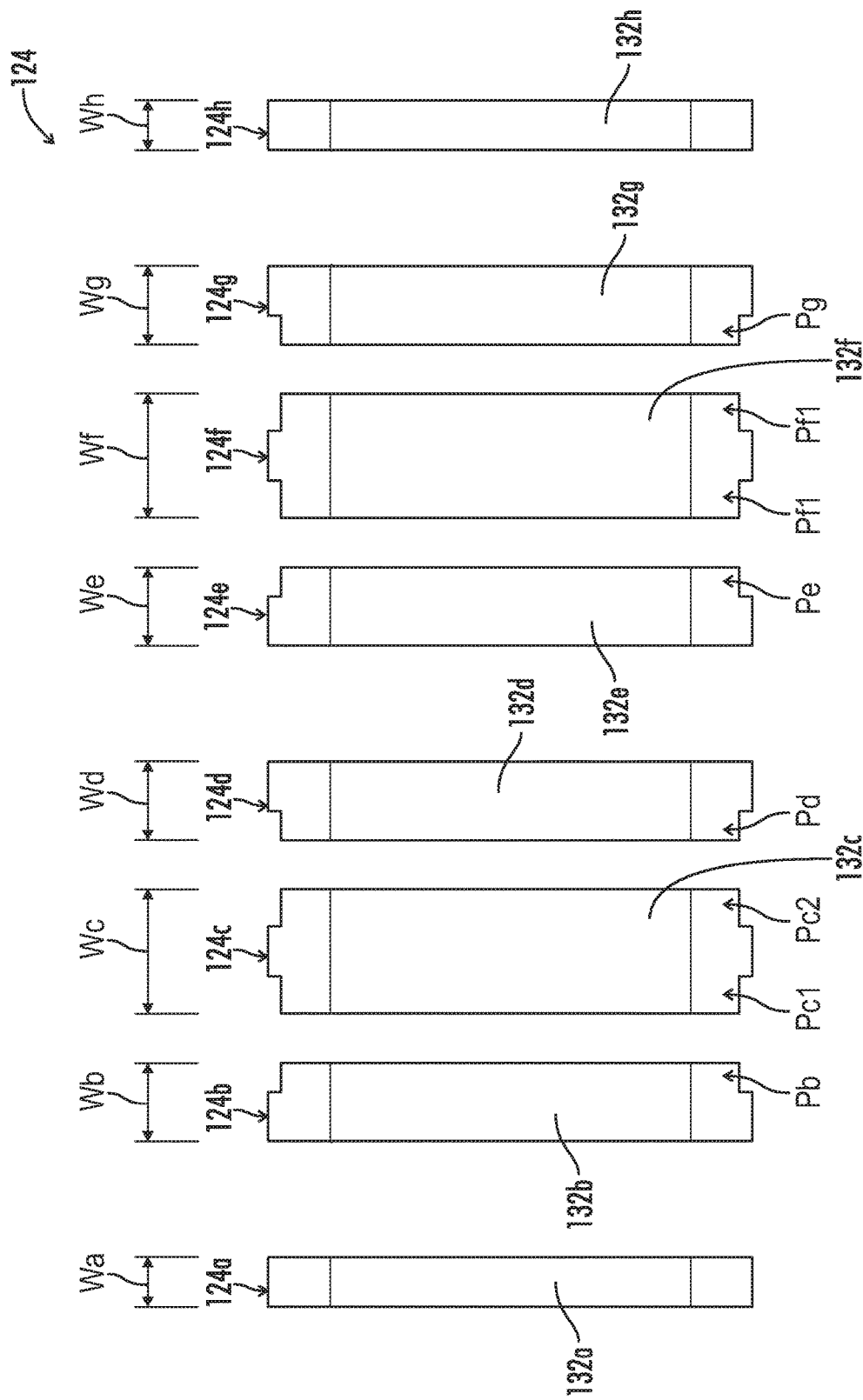
FIG. 12 is top plan view of the plug contacts of FIG. 10.

As can best be seen in FIG. 12, each plug contact 124 further includes a bridge portion 132 between the respective first end 126 and second end 128. As such, each respective plug contact 124a-124h includes a bridge portion 132a-132h. The resulting shape of each plug contact 124 resembles a staple as shown in FIG. 11, having, for example, rounded engagement portions between the bridge and the respective ends. The plug contacts are not necessarily so limited, however, and in alternative embodiments within the scope of the present disclosure it may be understood that the engagement portions may be squared, beveled, or the like.

Returning to FIG. 12, adjacent plug contacts may be considered as forming electrodes which, in combination with a dielectric disposed there between, further effectively forms a capacitive coupling. For example, a first compensating capacitance 134 is defined between the second plug contact 124b and the third plug contact 124c. A second compensating capacitance 136 is defined between the third plug contact 124c and the fourth plug contact 124d. A third compensating capacitance 138 is defined between the fifth plug contact 124e and the sixth plug contact 124f. A fourth compensating capacitance 140 is defined between the sixth plug contact 124f and the seventh plug contact 124g. Due to the configuration of connector assembly, each of the compensating capacitances 134-140 are provided proximate the contact interface 130. The compensating capacitances 134-140 are defined to compensate for near end cross talk (NEXT) at the connector interface between the modular plug 100 and the corresponding female connector jack 10 created by interaction of signals having signal frequencies in a data transmission bandwidth. The data transmission bandwidth includes signal frequencies between 10 MHz and 2000 MHz. The compensating capacitances 134-140 are further defined based on proximity of the plug contacts 124 to the contact interface 130 and a corresponding reduction in phase shift. For embodiments of a connector plug as disclosed herein such as connector plug 100, wherein the plug contacts 124 themselves are both of the electrodes of capacitors formed between adjacent contacts and also defining the contact interface 130 with a mated jack, the distance between a capacitor and the contact interface (i.e., capacitance in the immediate vicinity of the contact interface) is effectively zero.

In one practical and illustrative example, non-limiting on the scope of an invention disclosed herein, the capacitance between contacts 2 and 3 and between contacts 6 and 7 may be controlled (for example by the distance between the contacts, the dielectric constant, etc., as further described below) to from 30-150 fF, with a preferred value of 110 fF. The capacitance between contacts 3 and 4 and between contacts 5 and 6 may be controlled to from 50-250 fF, with a preferred value of 170 fF.

Each plug contact 124 includes a maximum width W extending in a direction perpendicular to the length L of the PCB 102. At least one of the plug contacts 124 has a maximum width W greater than the maximum width of another plug contact. For instance, the first plug contact 124a includes a maximum width Wa and the second plug contact 124b includes a maximum width Wb that is greater than the maximum width of the first plug contact. The remaining plug contacts 124c-124h similarly include respective maximum widths We-Wh. Particularly, the maximum width We of the third plug contact 124c and the maximum width Wf of the sixth plug contact 124f are greater than the maximum widths Wa, Wb, Wd, We, Wg, Wh of the remaining respective plug contacts 124a, 124b, 124d, 124e, 124g, 124h. The maximum width Wb of the second plug contact 124b, the maximum width Wd of the fourth plug contact 124d, the maximum width We of the fifth plug contact 124e, and the maximum width Wg of the seventh plug contact 124g are greater than the maximum widths Wa and Wh of the respective plug contacts 124a and 124h.

At least one plug contact 124 includes a protrusion P extending from only one side of the plug contact in a direction towards an adjacent plug contact. For instance, the second plug contact 124b includes a protrusion Pb extending from only one side, the fourth plug contact 124d includes a protrusion Pd extending from only one side, the fifth plug contact 124e includes a protrusion Pe extending from only one side, and the seventh plug contact 124g includes a protrusion Pg extending from only one side. Also, the third plug contact 124c includes protrusions Pc1 and Pc2 extending from both sides of the plug contact. The sixth plug contact 124f similarly includes protrusions Pf1 and Pf2 extending from both sides of the plug contact. Each protrusion P on a respective plug contact 124 may be integrally formed with the plug contact or may be secured to the plug contact in any suitable manner.

Figure 9:
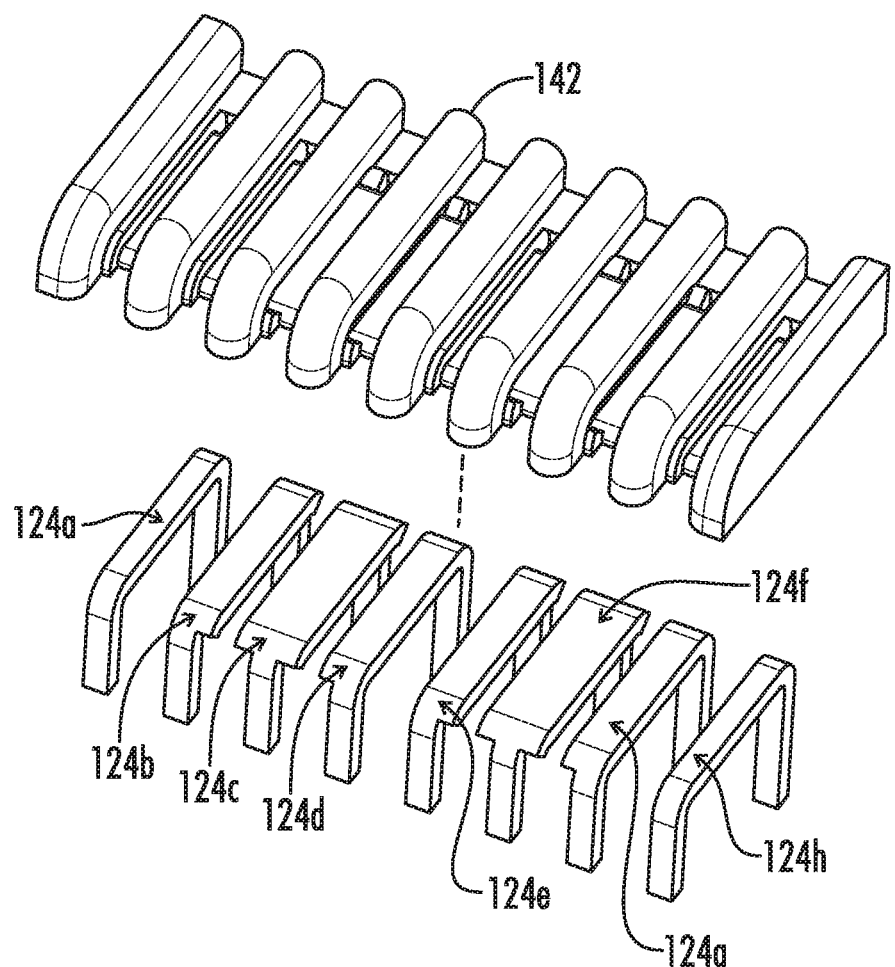
FIG. 9 is a perspective view of the plug contacts of the connector plug of FIG. 1 with the insulative material exploded therefrom.

As shown in FIGS. 2 and 9, the connector assembly 122 further includes an insulative material 142 (e.g., plastic) at least partially covering the plug contacts 124. Particularly, the plug contacts 124 may be over-molded with the insulative material 142. The insulative material 142 may generally fill the gaps between adjacent contacts and thereby be implemented as the dielectric separating the respective electrodes for the aforementioned capacitors. The compensating capacitance may itself be controlled based on at least the distance between the respective electrodes and the dielectric constant of the insulative material.

Turning to FIGS. 4, 5, 7, and 8, a plurality of conductor traces 144 are disposed on the PCB 102 and electrically connect each of the plug contacts 124 to a respective cable of the cable pairs 114, 116, 118, 120. Particularly, the first conductor trace 144a electrically connects the first plug contact 124a to the cable 114a of the first cable pair 114, the second conductor trace 144b electrically connects the second plug contact 124b to the cable 114b of the first cable pair, the third conductor trace 144c electrically connects the third plug contact 124c to the cable 116a of the second cable pair 116, the fourth conductor trace 144d electrically connects the fourth plug contact 124d to the cable 118a of the third cable pair 118, the fifth conductor trace 144e electrically connects the fifth plug contact 124e to the cable 118b of the third cable pair, the sixth conductor trace 144f electrically connects the sixth plug contact 124f to the cable 116b of the second cable pair, the seventh conductor trace 144g electrically connects the seventh plug contact 124g to the cable 120a of the fourth cable pair 120, and the eighth conductor trace 144h electrically connects the eighth plug contact 124h to the cable 120b of the fourth cable pair.

Figure 8:
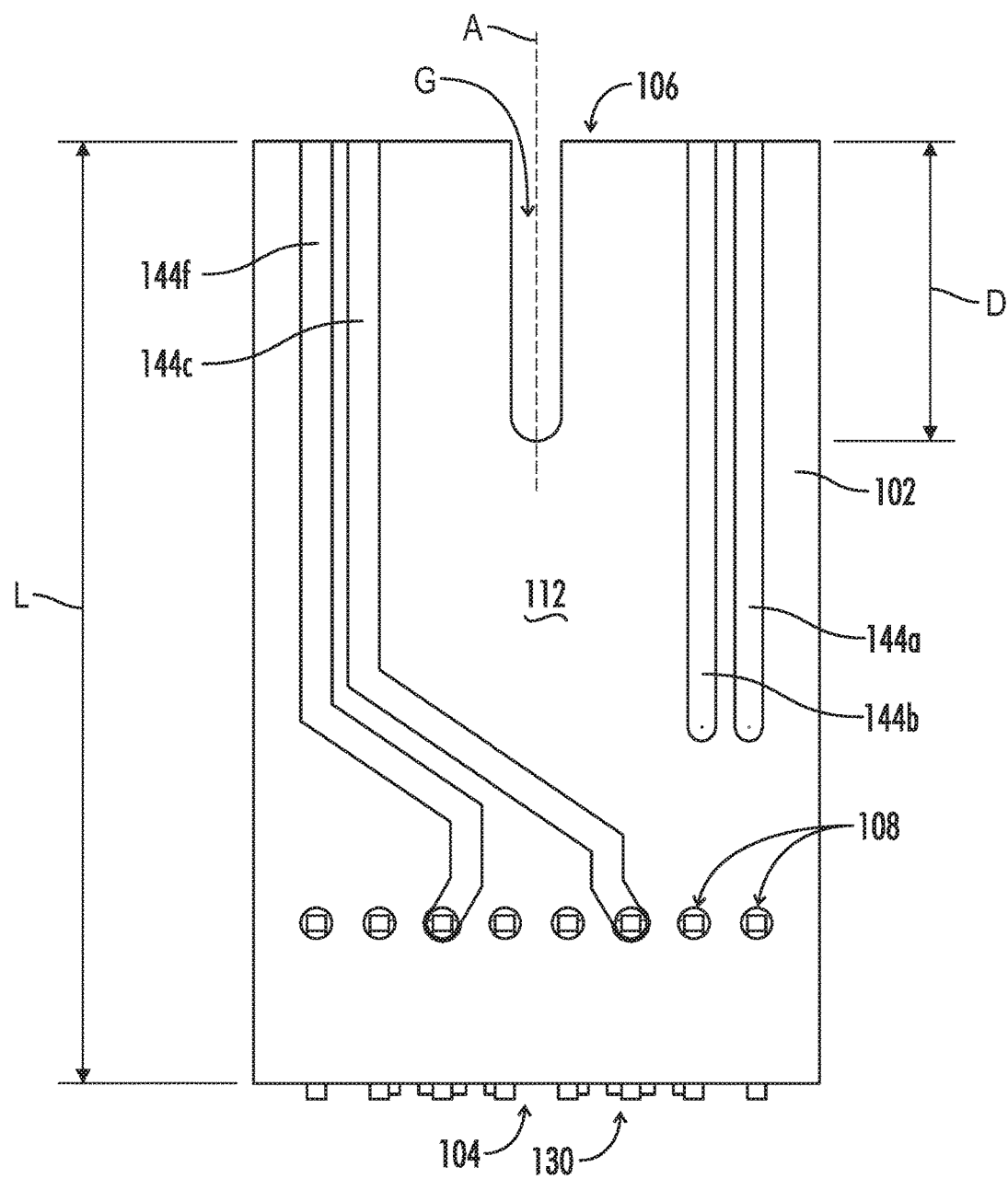
FIG. 8 is a bottom plan view of the components of FIG. 7.

As best shown in FIGS. 7 and 8, the PCB 102 further defines an air gap G extending a distance D along the length L of the PCB. The air gap G is located between two adjacent conductor traces 144. A longitudinal axis A of the air gap G extends parallel to the adjacent conductor traces 144. As previously noted, the inductance between cable pairs, or in-plug mutual inductance, may be controlled by the presence and configuration of the air gap within the PCB.

As shown in FIGS. 2 and 3, an insulative plug body 14 includes an interior 16 configured to laterally receive the PCB 102. The plug body 14 also includes an exposed face portion 18 corresponding to the contact interface 130 when the PCB 102 is received therein. Some embodiments of the plug body 14 may include a conductive shield 20 positioned corresponding with the air gap G of the PCB 102 when the PCB is received therein. The shield 20 includes a planar section 22 extending in a direction perpendicular to the longitudinal axis A of the air gap G. The shield 20 further includes flanges 24 extending perpendicularly from the planar section 22 along the cable end 106 of the PCB 102.

Turning now to FIGS. 13-19, a second embodiment of a modular connector plug 200 is shown. As with the first embodiment, the connector plug 200 forms a connector interface with a corresponding female connector jack 10 in a high speed data transmission network. Many of the features of the modular connector plug 200 are like those of modular connector plug 100 discussed above. Like components may utilize the reference numerals or reference characters the same as those discussed above. Different or slightly altered components may utilize reference numerals or reference characters similar to those discussed above but an order of one-hundred greater. Some exemplary differences will be described herein to aid in understanding potential different arrangements.

Figure 13:
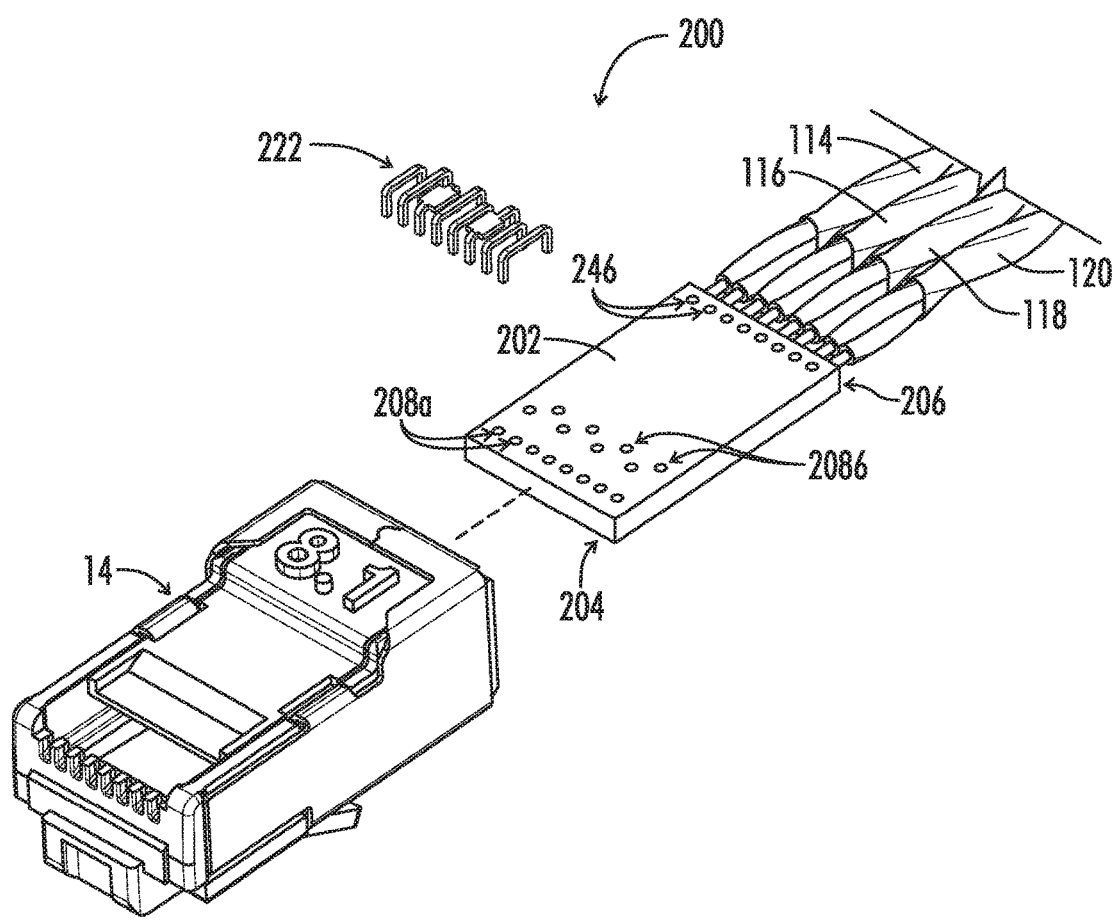
FIG. 13 is a perspective view of a second embodiment of a modular connector plug for data transmission.
Figure 14:
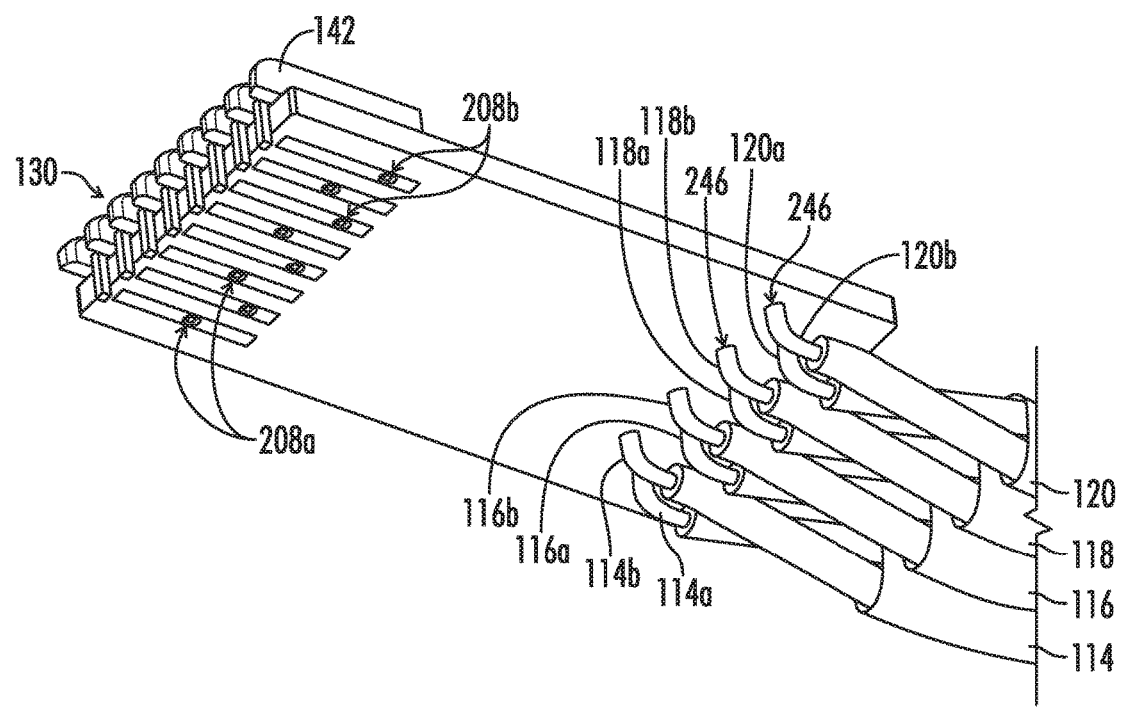
FIG. 14 is a bottom perspective view of the PCB, plug contacts, insulative material, and cable pairs of the connector plug of FIG. 13.
Figure 15:
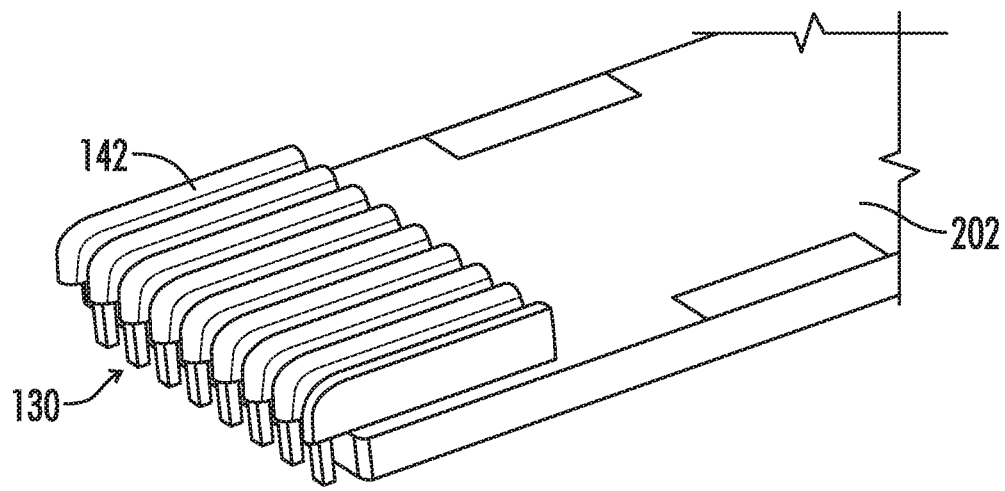
FIG. 15 is a top perspective view of the PCB, plug contacts, and insulative material of the connector plug of FIG. 13.
Figure 16:
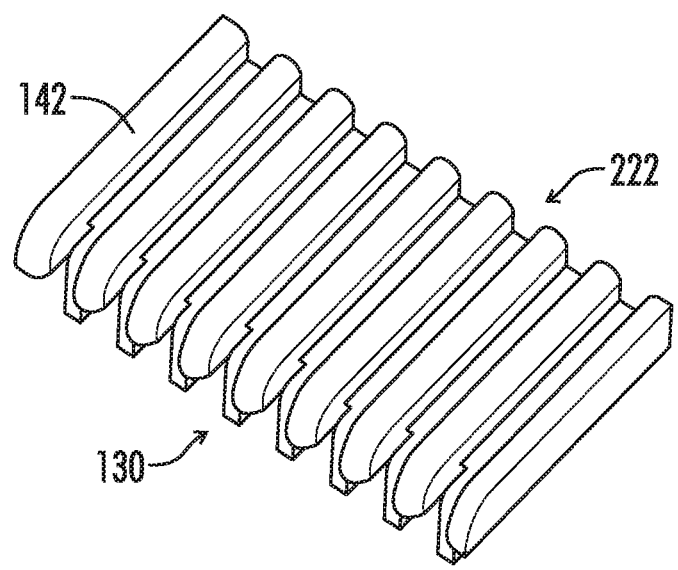
FIG. 16 is a top perspective view of the plug contacts and insulative material of the connector plug of FIG. 13.
Figure 17:
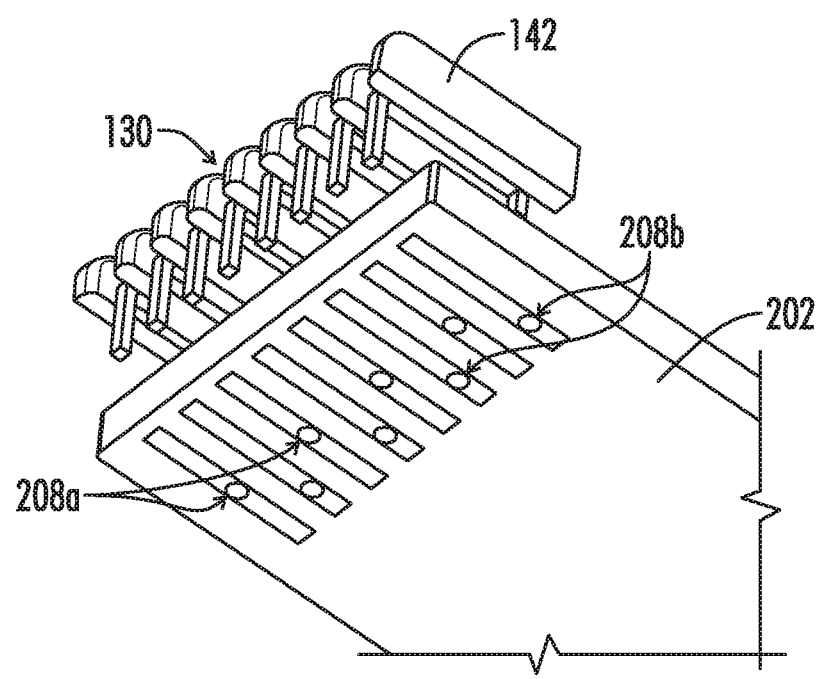
FIG. 17 is a bottom perspective view of the PCB of the connector plug of FIG. 13 with the plug contacts and insulative material exploded therefrom.
Figure 18:
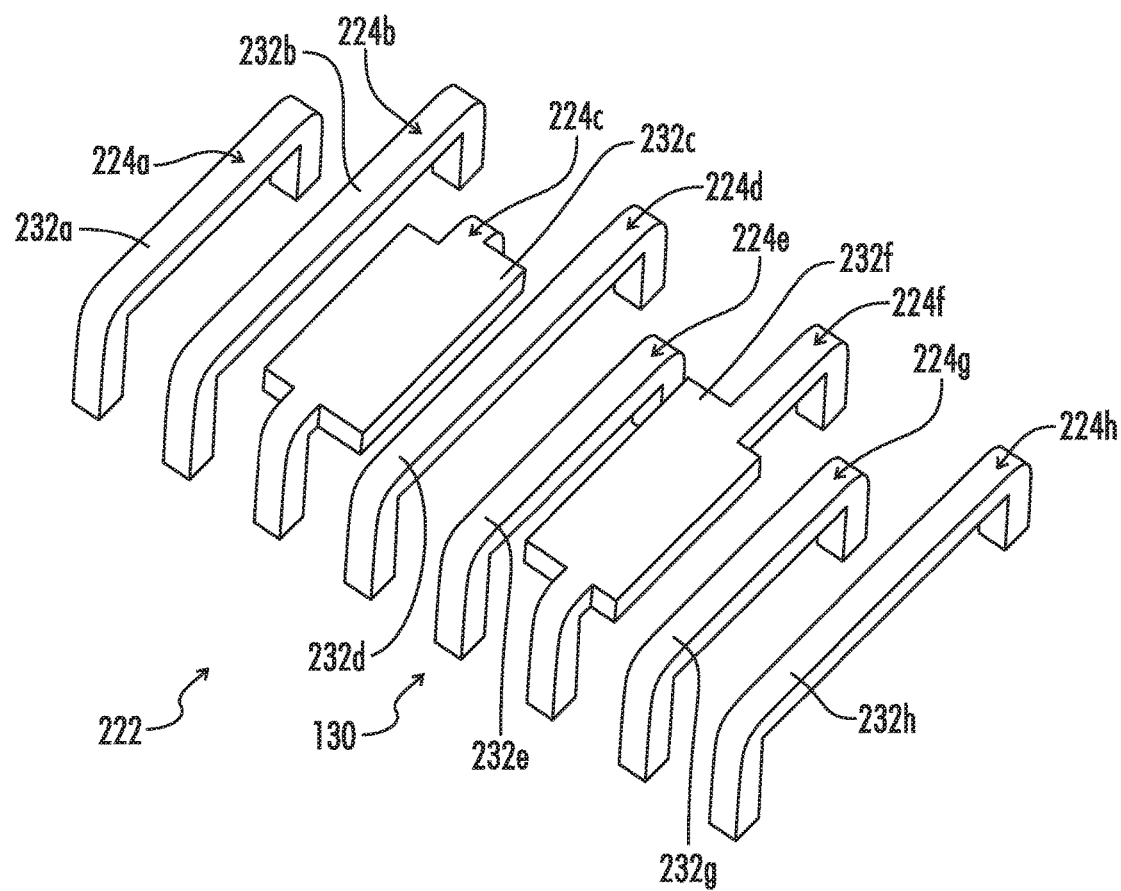
FIG. 18 is a perspective view of the plug contacts of the connector plug of FIG. 13.
Figure 19:
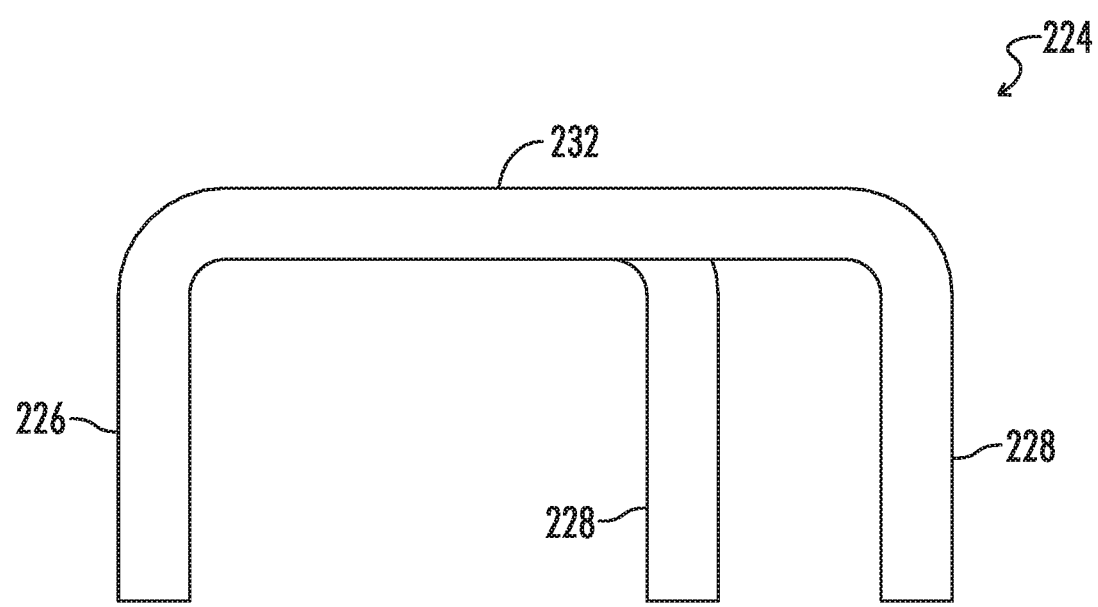
FIG. 19 is a side elevation view of the plug contacts of FIG. 18.
Figure 20:
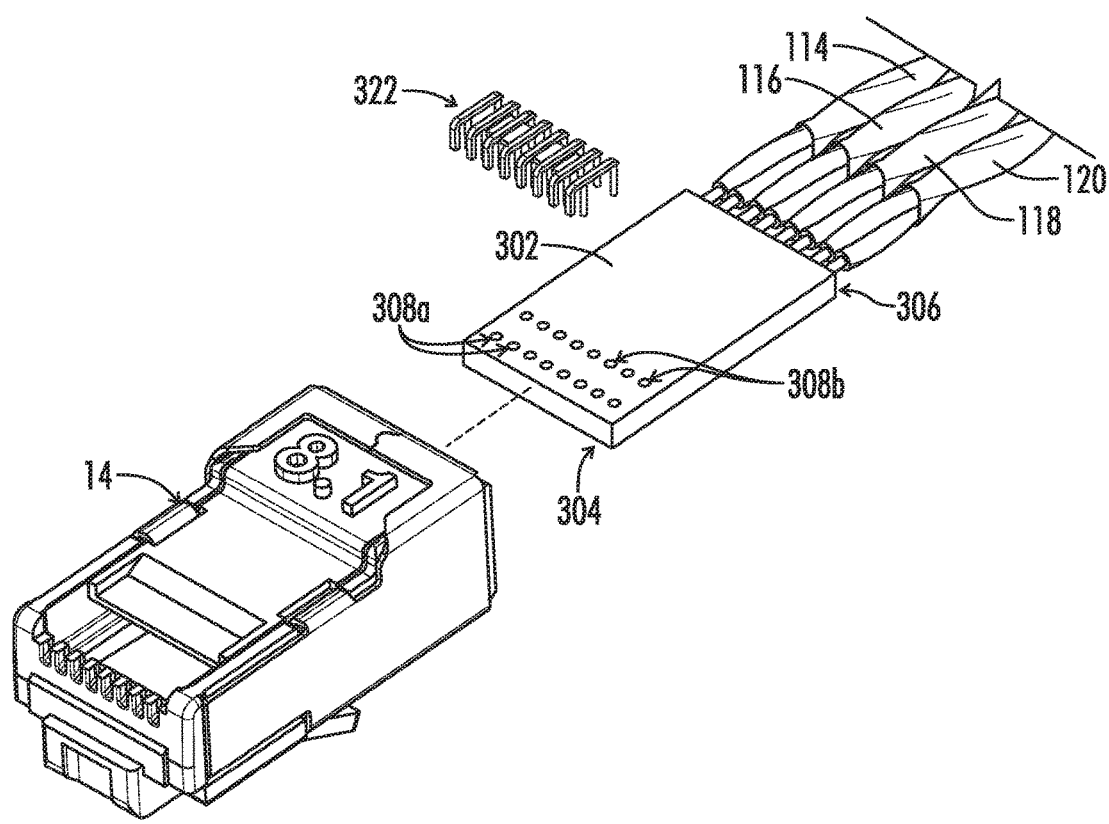
FIG. 20 is a perspective view of a third embodiment of a modular connector plug for data transmission.

As shown in FIGS. 13 and 14, the contact holes 108 may form two rows including a row of first contact holes 208a and a row of second contact holes 208b. The first contact holes 208a are closer to the contact end 204 of the PCB 202. In this configuration, at least one plug contact 224 of the connector assembly 222 has a bridge portion 232 with a length from the first end 226 to the second end 228 that is shorter than a bridge portion of another plug contact (as best seen in FIG. 18). Particularly, the bridge portions 232a, 232c, 232e, 232g of respective plug contacts 224a, 224c, 224e, 224g are shorter than the bridge portions 232b, 232d, 232f, 232h of respective plug contacts 224b, 224d, 224f, 224h. In this configuration, the bridge portion 232 lengths of the plug contacts 224 alternate sequentially along a direction perpendicular to the circuit board length L. As shown in FIG. 14, the first group of plug contacts 224a, 224c, 224e, 224g has the respective first ends 226a, 226c, 226e, 226g connected to the PCB 202 in parallel along a direction perpendicular to the circuit board length L. The second group of plug contacts 224b, 224d, 224f, 224h has the respective first ends 226b, 226b, 226f, 226h connected to the PCB 202 in parallel along a direction perpendicular to the circuit board length L. The cables 114a, 114b, 116a, 116b, 118a, 118b, 120a, 120b are connected to the PCB 202 with the cables inserted in respective vias 246 located nearer the cable end 206 than the contact end 204 of the PCB. The vias 246 may be either recesses, through holes, or any other appropriate connection point on or in the PCB 202 such that each of the vias 246 are electrically connected to a corresponding one of the contact holes 208a, 208b.

Figure 21:
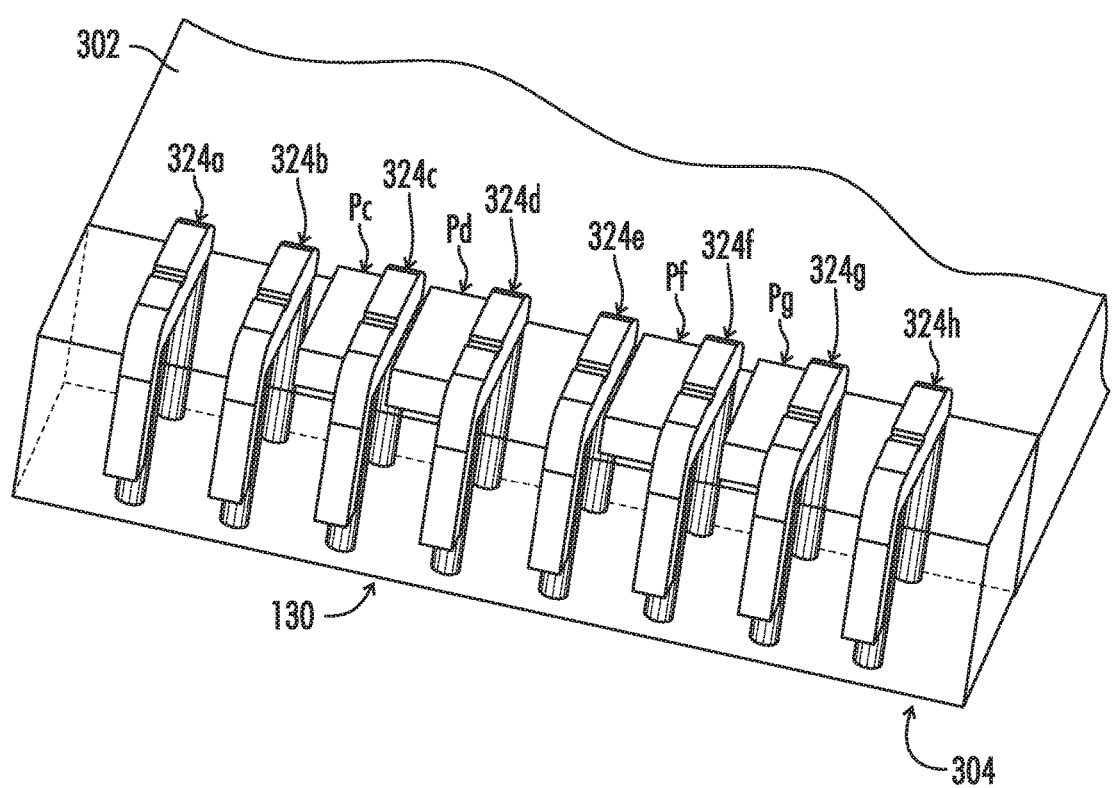
FIG. 21 is top perspective view of the PCB and the plug contacts of the connector plug of FIG. 20.
Figure 22:
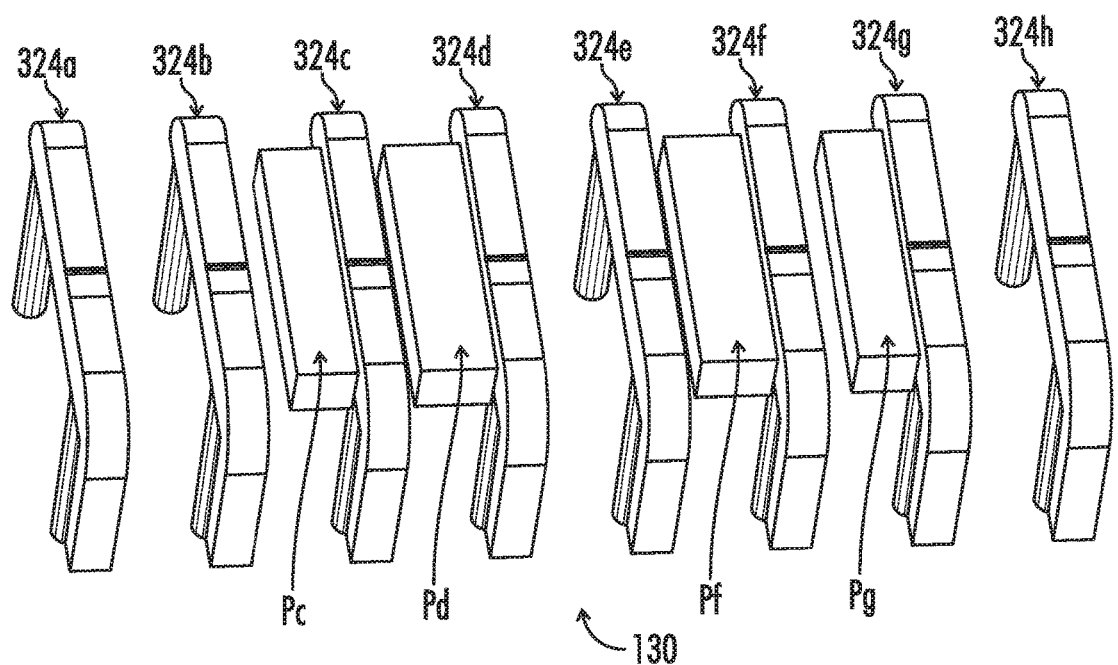
FIG. 22 is a perspective view of the plug contacts of the connector plug of FIG. 20.
Figure 23:
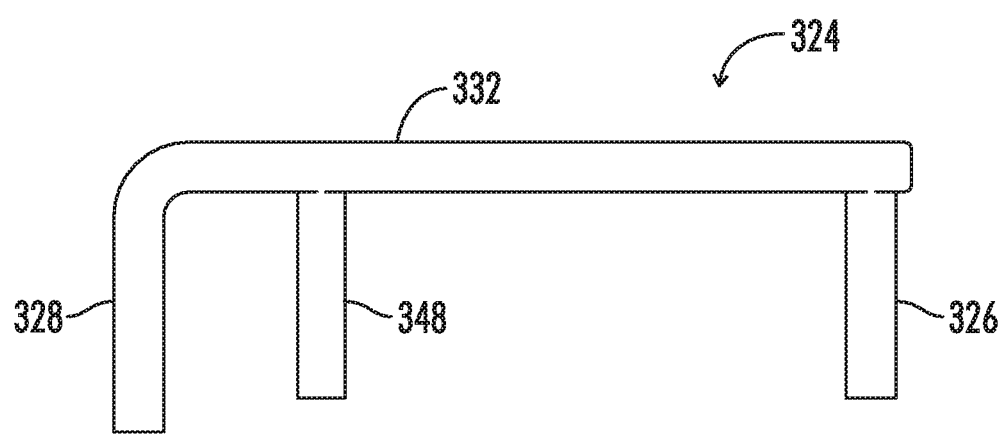
FIG. 23 is a side elevation view of the plug contacts of FIG. 20.
Figure 24:
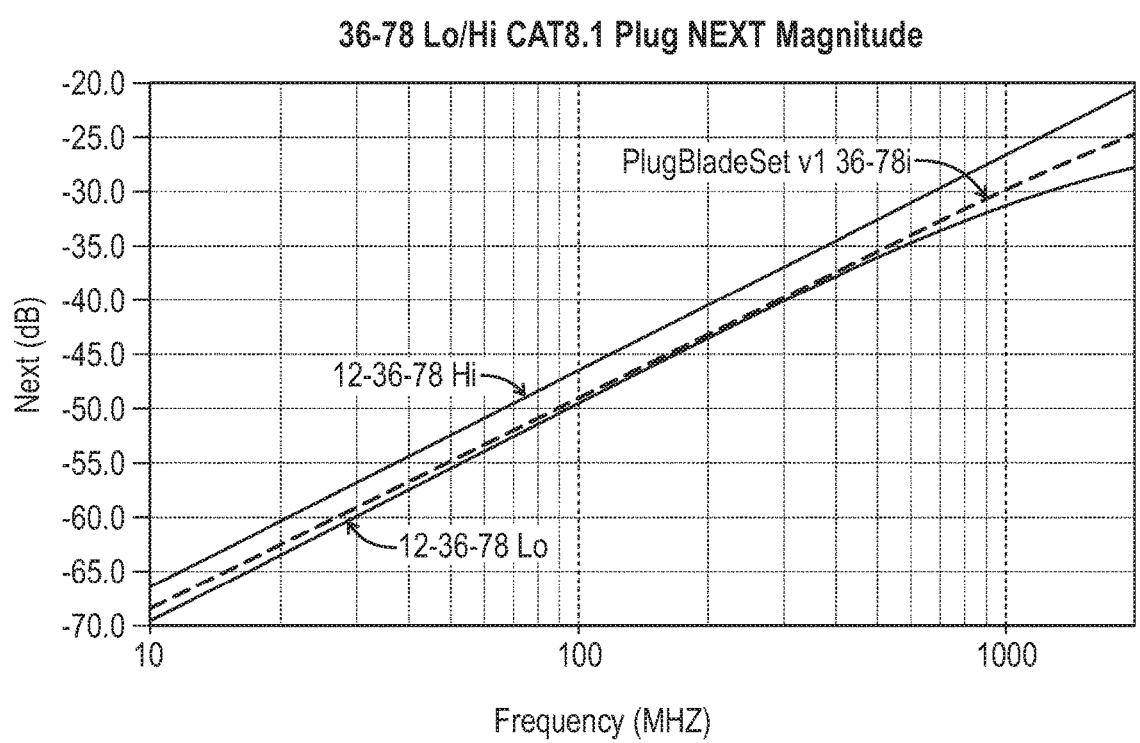
FIG. 24 is a computer simulation of near end cross talk with respect to frequency for the connector plug of FIG. 20.
Figure 25:
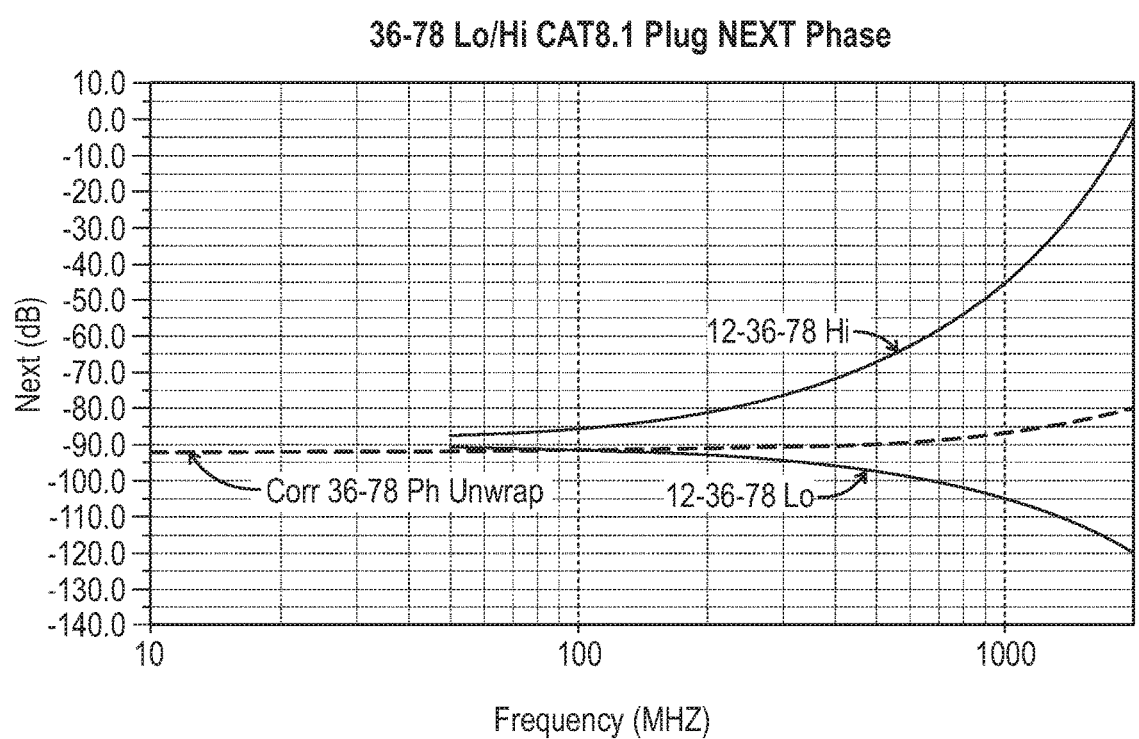
FIG. 25 is a computer simulation of near end cross talk with respect to frequency for the connector plug of FIG. 20.
Figure 26:
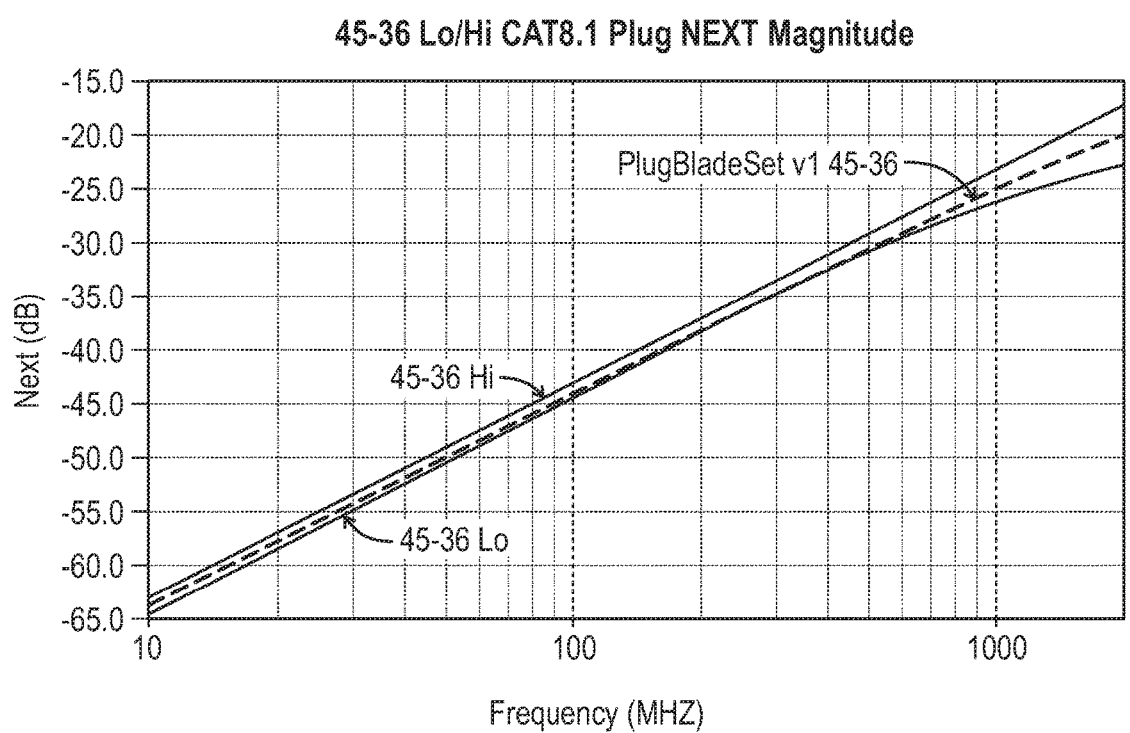
FIG. 26 is a computer simulation of near end cross talk with respect to frequency for the connector plug of FIG. 20.
Figure 27:
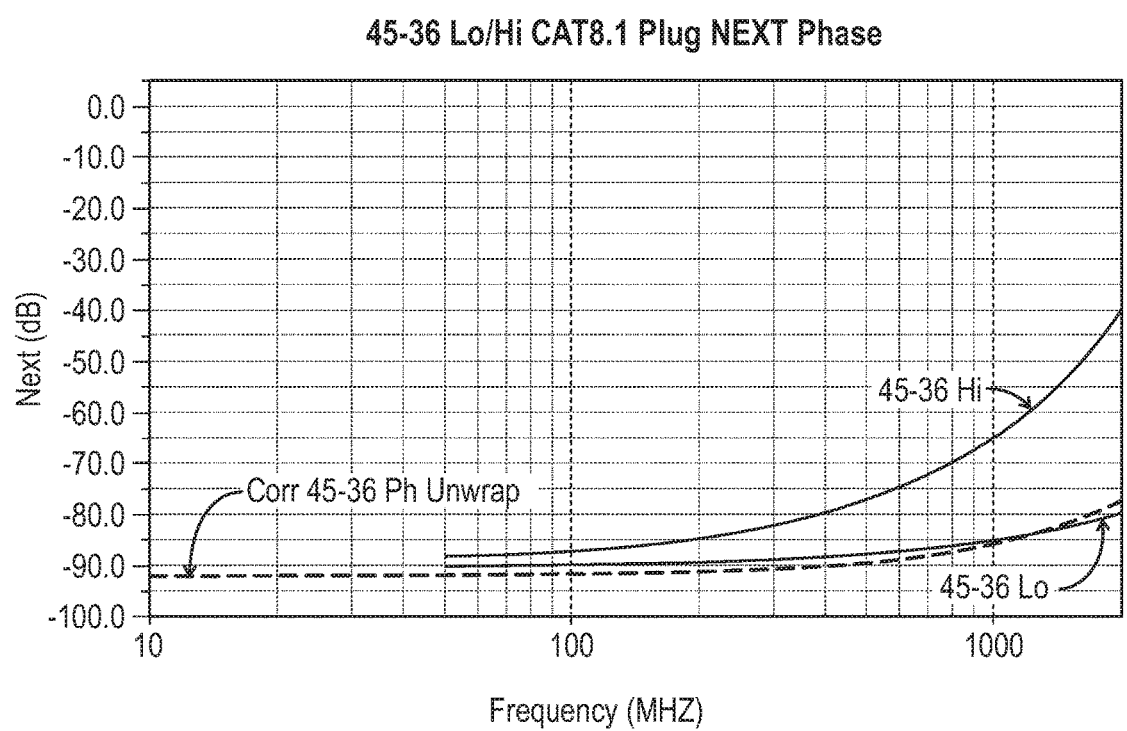
FIG. 27 is a computer simulation of near end cross talk with respect to frequency for the connector plug of FIG. 20.
Figure 28:
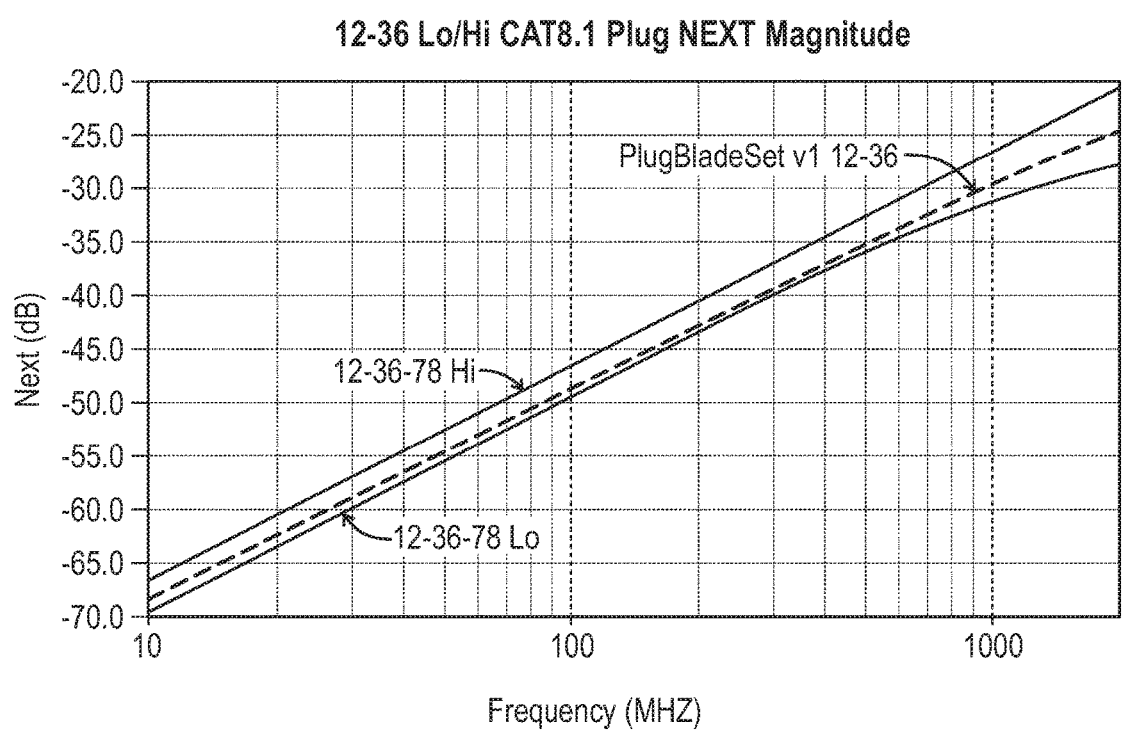
FIG. 28 is a computer simulation of near end cross talk with respect to frequency for the connector plug of FIG. 20.
Figure 29:
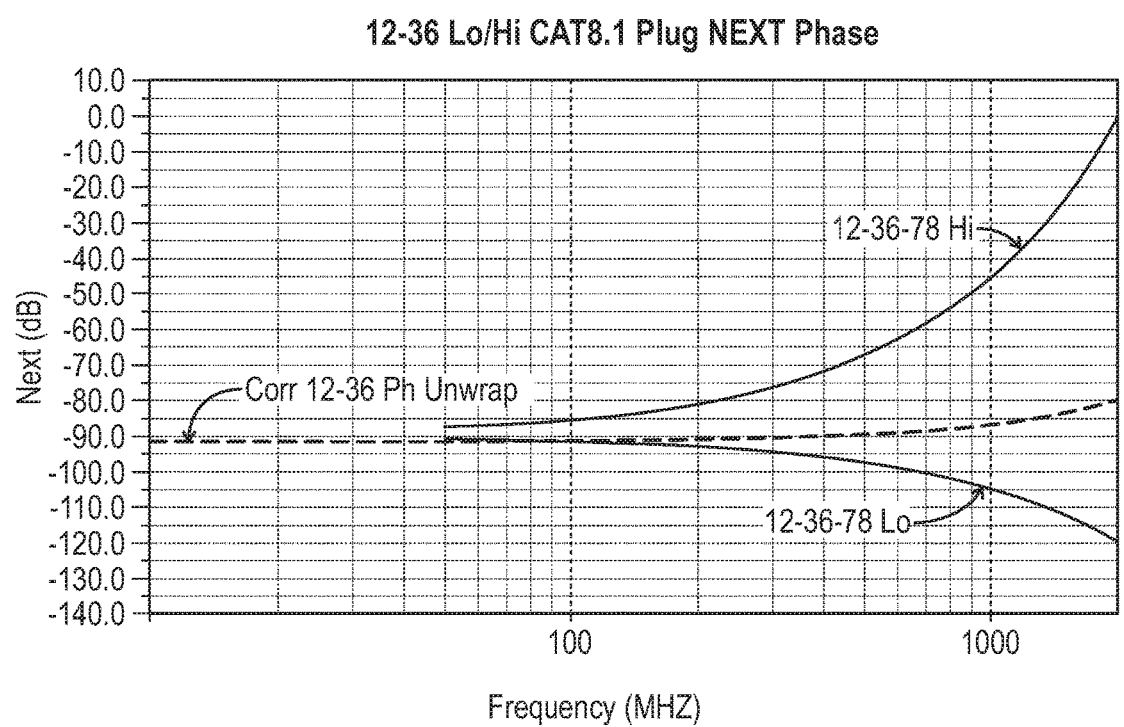
FIG. 29 is a computer simulation of near end cross talk with respect to frequency for the connector plug of FIG. 20.
Figure 30:
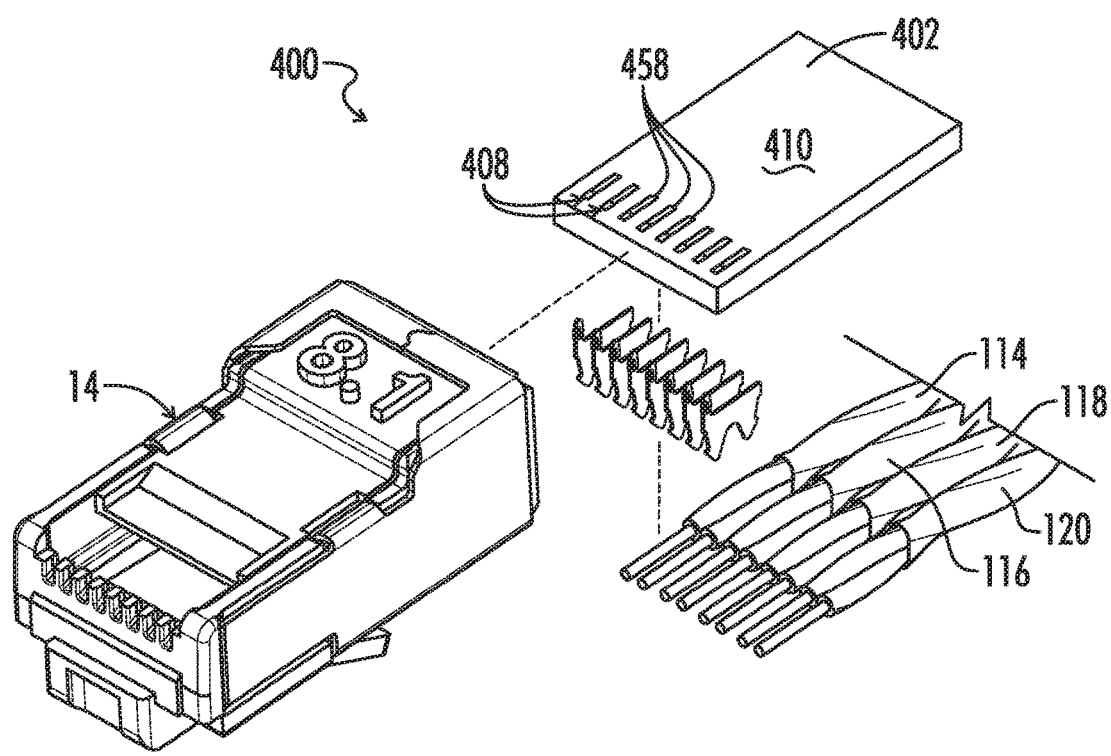
FIG. 30 is a perspective view of a fourth embodiment of a modular connector plug for data transmission.

With regard to FIGS. 20-29, a third embodiment of a modular connector plug 300 is shown. The PCB 302 includes a first row of vias 308a and a second row of vias 308b. The first row of vias 308a is closer to the contact end 304 than the cable end 306 of the PCB 302. In this configuration (as shown in FIGS. 21-23), each of the plug contacts 324 includes a first end 326, a second end 328, and an intermediate post 348 connected to the bridge portion 332 between the first end and the second end. Each of the respective plug contacts 324a-324h are identical except for the inclusion of a protrusion Pc on plug contact 324c, a protrusion Pd on plug contact 324d, a protrusion Pf on plug contact 324f, and a protrusion Pg on plug contact 324g.

In such an embodiment the distance between the jack-plug contact interface and the capacitor formed between contacts is very short, resulting in negligible self-inductance and phase shift. All of the contacts 324 may further have approximately the same length as being disposed in parallel with respect to the PCB 302.

FIGS. 24-29 illustrate computer simulations of the design of the modular plug 300.

In such embodiments of a connector plug as previously disclosed herein, wherein the contacts themselves define electrodes for a capacitor between contacts, one of skill in the art will appreciate that the length of the contacts and the spacing between contacts will at least partially define the capacitance. In one particular and non-limiting example, the overall length of short contacts may be set between 0.050" and 0.100", with a preferred length of about 0.086". The overall length of long contacts may be set between 0.080" and 0.160", with a preferred length of about 0.106".

In an exemplary configuration, the distance from the interface surface to the top of the PCB may be set between 0" and 0.040", with a nominal setting of 0.020". The distance from the interface point to the PCB along the contact may be set between 0.040" and 0.160", or for example about 0.082" for short contacts and 0.102" for long contacts.

Exemplary spacing between the various contacts may be set between 0.004" and 0.050", or for example nominal values of 0.013" between contacts 3 and 4 and between contacts 5 and 6, and for example nominal values of 0.028" in spacing between the other contacts. The stagger or offset between adjacent short and long contacts may be set between 0.010" and 0.060", with a nominal value of 0.020".

Figure 31:
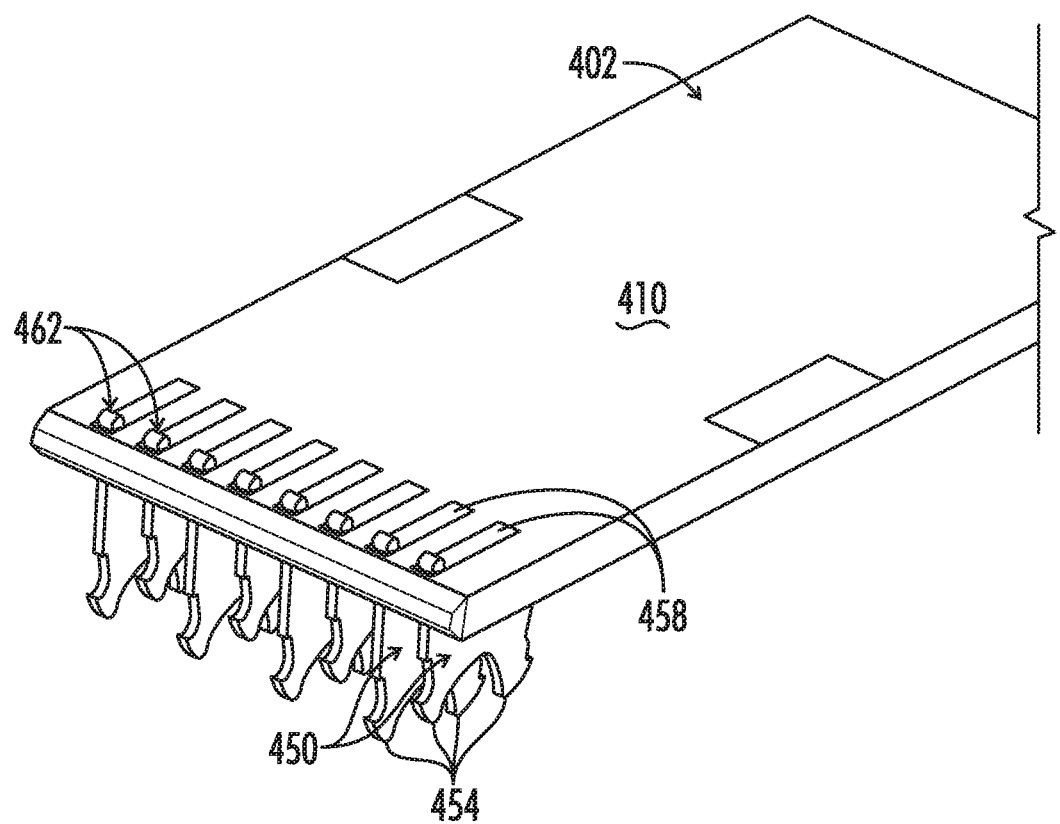
FIG. 31 is a top perspective view of the PCB and the contact blades of the connector plug of FIG. 30.
Figure 32:
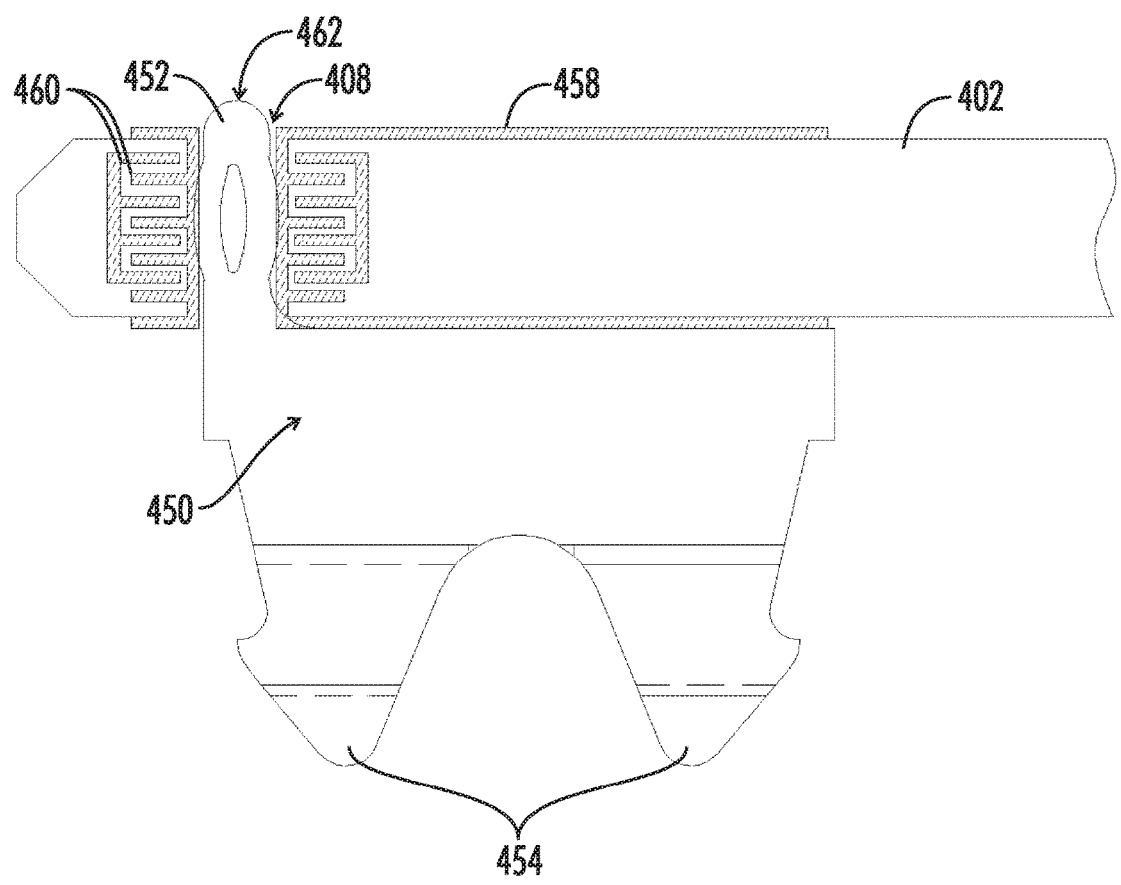
FIG. 32 is a cross-sectional side elevation view of the PCB and a contact blade of the connector plug of FIG. 30.
Figure 33:
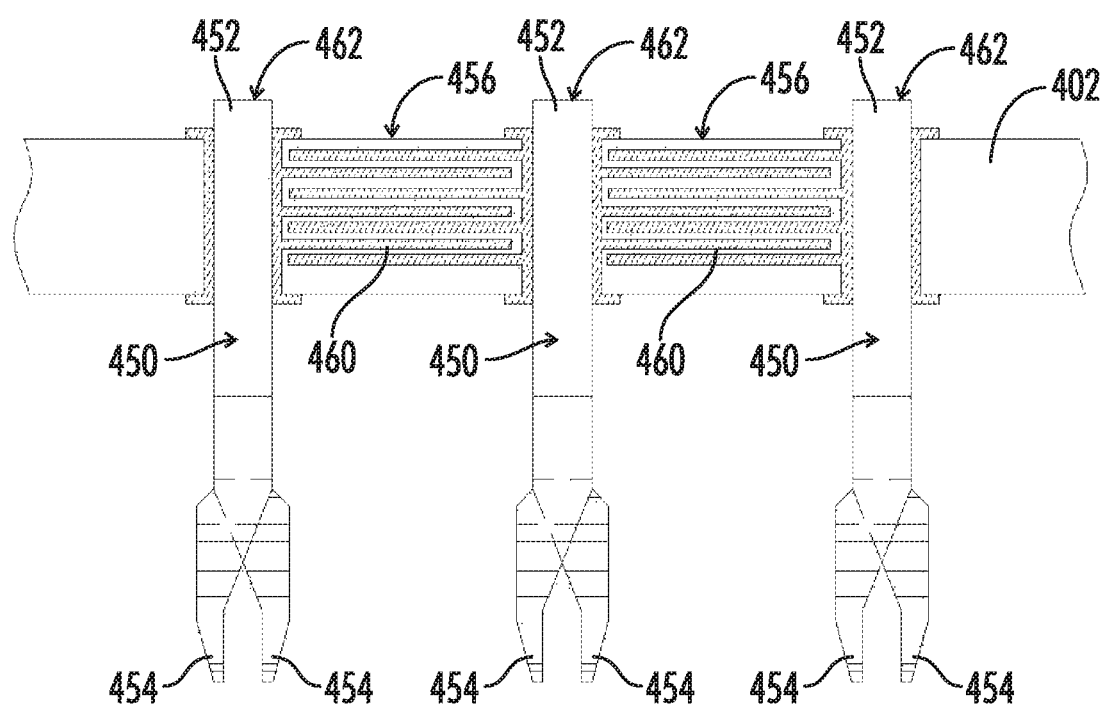
FIG. 33 is a cross-sectional front elevation view of the PCB and contact blades of the connector plug of FIG. 30.

Turning now to FIGS. 30-33, a fourth embodiment of a modular connector plug 400 is shown. The modular connector plug 400 includes a PCB 402 defining a plurality of contact holes 408 therein. As shown in FIGS. 31-33, each of a plurality of contact blades 450 include a respective plug portion 452 inserted in a respective contact hole 408. The contact blades 450 may be identical in various exemplary embodiments of the connector plug 400. Each contact blade 450 further includes an insulation piercing protrusion 454 opposite the plug portion 452. The connector plug 400 also includes a capacitance defined within the PCB 402 between each pair of adjacent contact holes 408. Each capacitance is defined by a first electrode 458 disposed on the PCB 402 in association with one contact hole 408 and a second electrode 460 for example disposed in association with an adjacent contact hole, and a dielectric 456 associated with an intervening portion of the PCB. Each contact hole 408 is a plated through hole in electrical connection with a respective electrode 458. Each first electrode 458 may be an annular electrode. When the connector plug 400 is assembled, each first electrode 458 and its respective contact blade 450 comprise a singular equipotential electrode. The capacitances may be in the form of multilayer capacitors disposed within the PCB 402 between respective adjacent contact holes 408. In such a configuration, the capacitance value for each multilayer capacitor may be reduced due to the contribution of the plug contacts 450 (relative to various other embodiments as disclosed herein) to from around 50 to around 2000 femto-farads.

The plug portion 452 of each contact blade 450 includes a plug end 462 that extends beyond a top surface 410 of the PCB 402 such that the plug end may come in contact with a corresponding female jack contact 12 when the plug 400 is inserted into a female connector jack 10. The insulation piercing protrusion 454 is disposed on a side of the PCB 402 that is opposite from the plug end 462. The contact holes 408 are through holes that are positioned in a row along the PCB 402.

Figure 34:
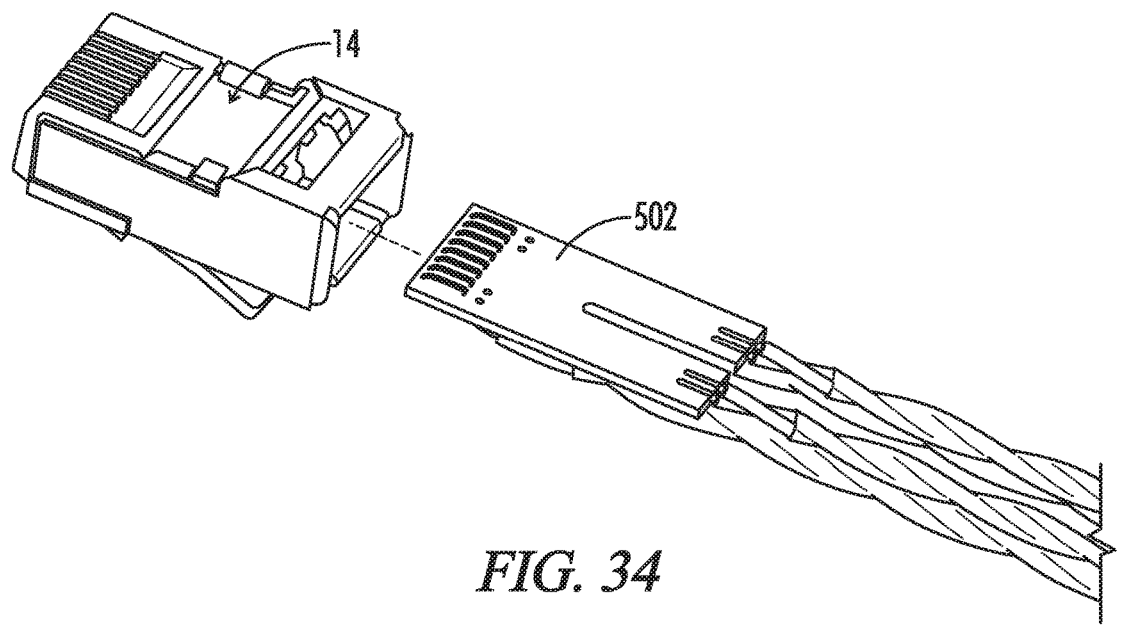
FIG. 34 is a perspective view of an alternative embodiment of the PCB.
Figure 35:
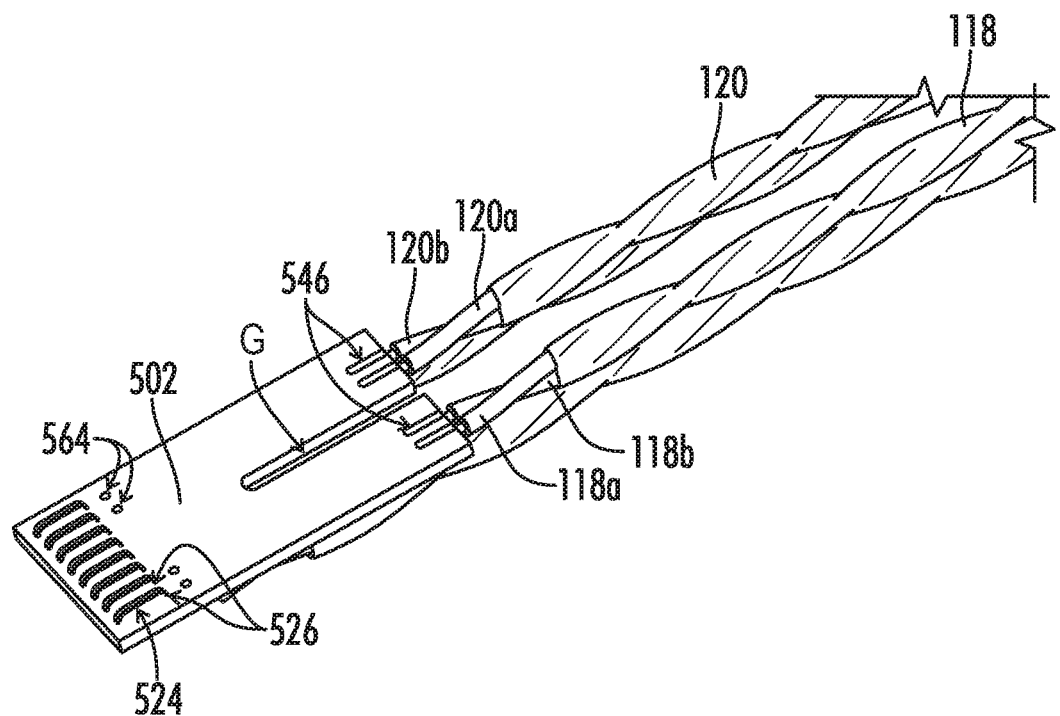
FIG. 35 is a top perspective view of the PCB of FIG. 34.
Figure 36:
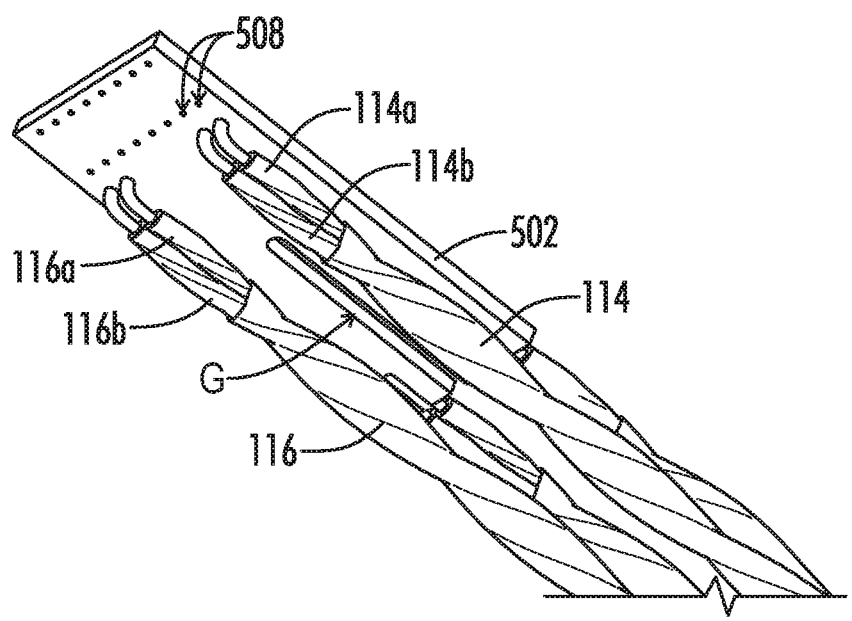
FIG. 36 is a bottom perspective view of the PCB of FIG. 34.

With reference to FIGS. 34-36, it is noted that the cable used for the Ethernet protocol communications is intended to support differential transmission and separated into twisted pairs. Various embodiments of a connector plug as disclosed herein promote minimal signal delay skew within the pairs and terminate each pair at the same distance from the contacts. For example, PCB 502 may be used with any of the prior or subsequently mentioned embodiments, and many features of the PCB 502 are similar to those discussed with various PCBs above. The PCB 502 differs in that it includes a first plurality of vias 508 that are each configured to receive respective first ends 526 of the corresponding plug contact 524; a second plurality of vias 546 located nearer the cable end 506 than the contact end 504 to receive a respective one of the cables 114a, 114b, 116a, 116b, 118a, 118b, 120a, 120b; and a third plurality of vias 564 located nearer the contact end than the cable end to receive a respective one of the cables. In some embodiments, the first cable pair 114 and second cable pair 116 may be received in the second plurality of vias 546 and the third cable pair 118 and fourth cable pair 120 may be received in the third plurality of vias 564.

Figure 37:
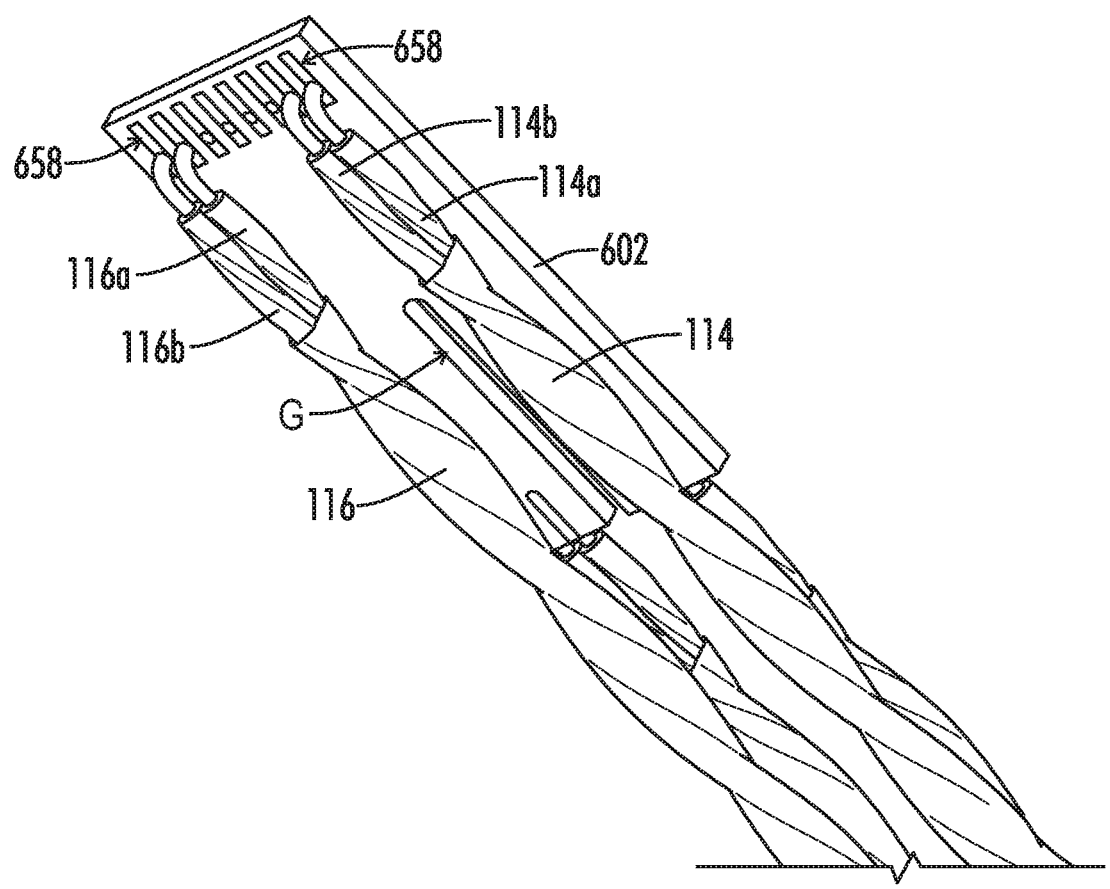
FIG. 37 is a bottom perspective view of an alternative embodiment of the PCB.

FIG. 37 shows an alternative PCB 602 that may be used with any of the prior or subsequently mentioned embodiments. The PCB 602 may include electrodes 658 that electrically connect with the cables 114a, 114b, 116a, 116b, 118a, 118b, 120a, 120b.

Figure 38:
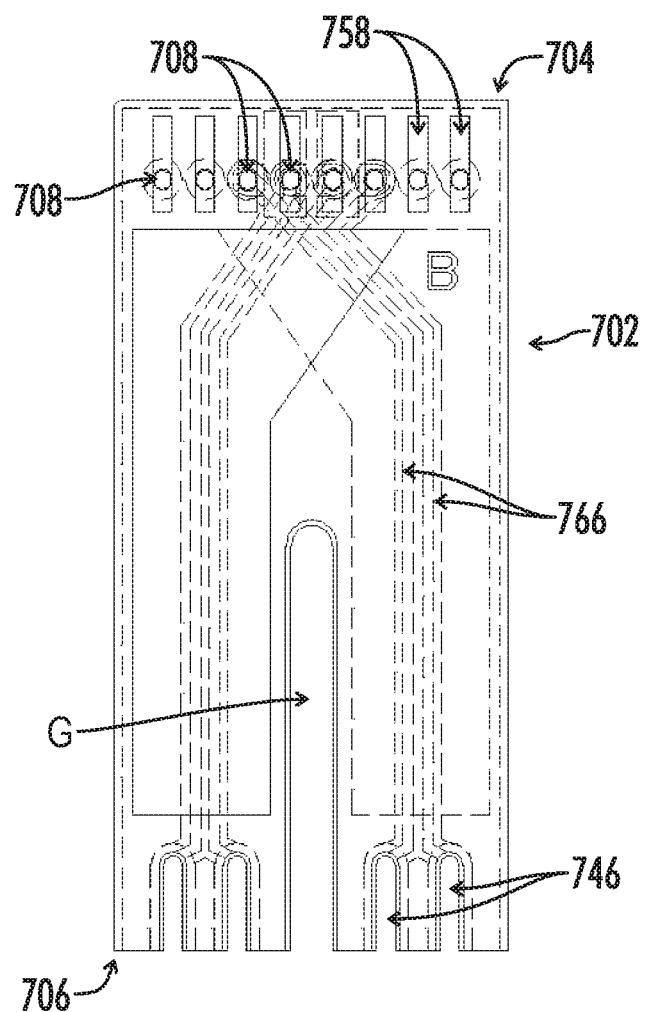
FIG. 38 is a schematic top plan view of yet another alternative embodiment of the PCB that may be used with a variety of connector plug configurations.
Figure 39:
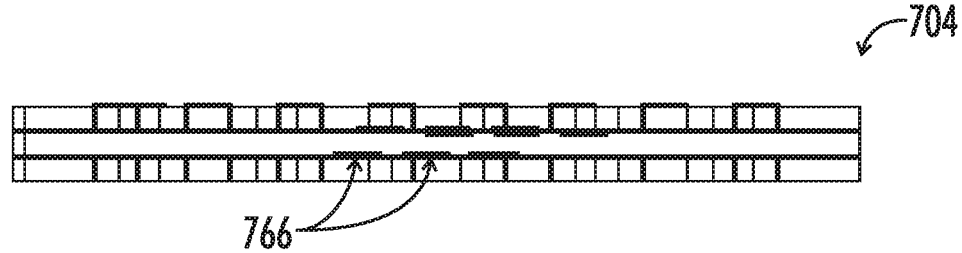
FIG. 39 is a cross-sectional front elevation view of the PCB of FIG. 38.

Turning now to FIGS. 38-47, an exemplary PCB 702 of the present disclosure is shown, wherein the transmission performance of the contact area is conserved and supported by the controlled electrical properties of the rest of the PCB 702. FIG. 38 is a schematic top view of the multilayer PCB 702 with conductive traces 766 in the internal layers of the PCB indicated with dotted lines. The conductive traces 766 lead from a second plurality of vias 746 nearer the cable end 706 than the contact end 704 to the first plurality of vias 708 that are configured to receive any appropriate plug contact. FIGS. 39-47 show additional features of the PCB 702. The conductive traces 766 are sandwiched between ground layers 768, 770, 772, 774, 776, 778. The ground layers surrounding the differential pairs leading to contacts 3 and 6 (counting from the right) are separated from the similar layers for pairs 4 and 5.

Further to avoid any inductive resonance coupling, an air gap G is arranged along the longitudinal axis of the PCB 702 and in parallel with the traces 766. Another function of the air gap G is to minimize the self-inductance of the ground planes by reducing their physical size and extent of the continuous dielectric material on which the ground planes are disposed.

Figure 48:
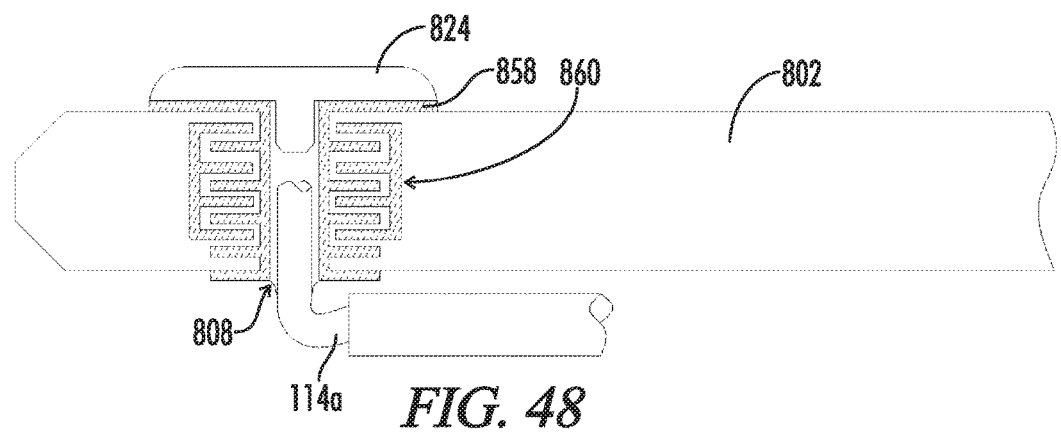
FIG. 48 is a detailed cross-section side elevation view through a plug contact of still another embodiment of the PCB and contacts assembly.
Figure 49:
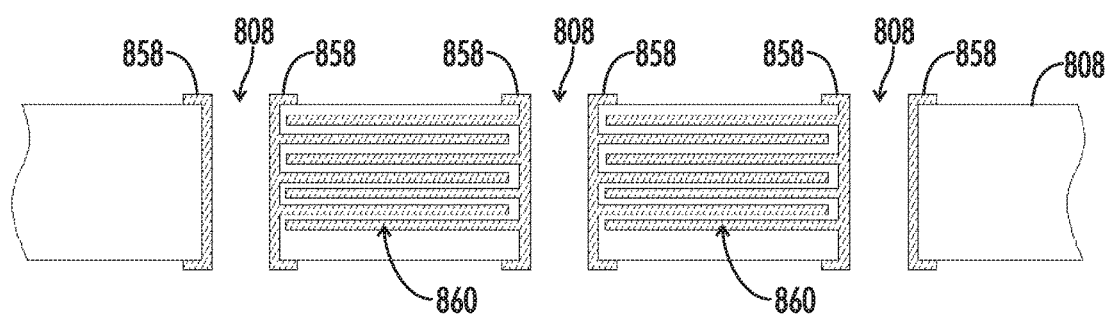
FIG. 49 is a detailed cross-section front elevation view through the contact holes of the assembly of FIG. 48.

FIGS. 48 and 49 illustrate an embodiment of the PCB 802 through a respective plug contact 824. Plated through holes 808 are formed in the PCB 802 and are electrically connected to a first electrode 858. A cable 114a is stripped of its primary insulation and inserted and soldered within the hole 808. The plug contact 824 is soldered to the same hole 808. The PCB 802 would typically include eight of these "mushroom"-shaped plug contacts 824 soldered into their respective holes 808. The contacts 824 are intimately electrically connected to a first annular electrode 858 and comprise a singular equipotential electrode. A multilayer capacitor 860 is accordingly disposed within the PCB 802, wherein one of the electrodes 858 is electrically connected to a first hole 808, while another of the electrodes is electrically connected to an adjacent hole, with a gap filled by a dielectric associated with the PCB. A capacitor may thus be formed between respective contacts 824. The value of each of the capacitors may be from 100 to 3000 femto-farads.

The contacts 824 are electrically coupled to corresponding jack contacts when the plug is inserted into a female jack connector.

FIG. 49 demonstrates a transverse cross-section through two capacitors 860. More particularly stated, an equipotential electrode 858, 824 form an electrode of a capacitor for a hole 808 with the second electrode being similarly formed of an electrode 858, 824 for an adjacent hole.

Figure 50:
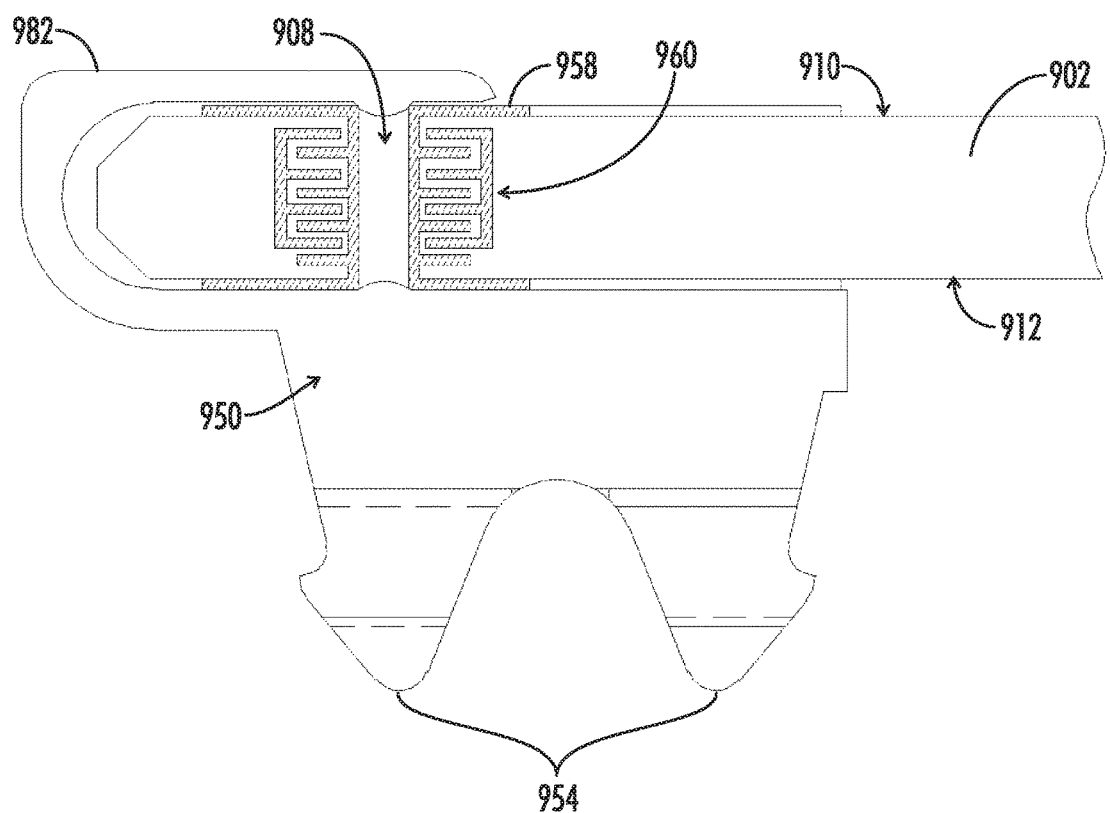
FIG. 50 is a detailed cross-section side elevation view of another embodiment of the PCB and contacts assembly.

FIG. 50 shows another embodiment of the PCB 902 including contact blades 950. The PCB 902 includes plated through holes 908, electrodes 958, 960 and a dielectric forming capacitors between the holes. Each contact blade 950 contacts the respective electrode 958 on both the top surface 910 and bottom surface 912 of the PCB 902. A contact point 982 of the contact blade 950 is where the contact blade makes electrical contact with the corresponding female jack contact 12. The contact blade 950 also includes insulation piercing protrusions 954 for engaging a respective cable 114a.

Figure 51:
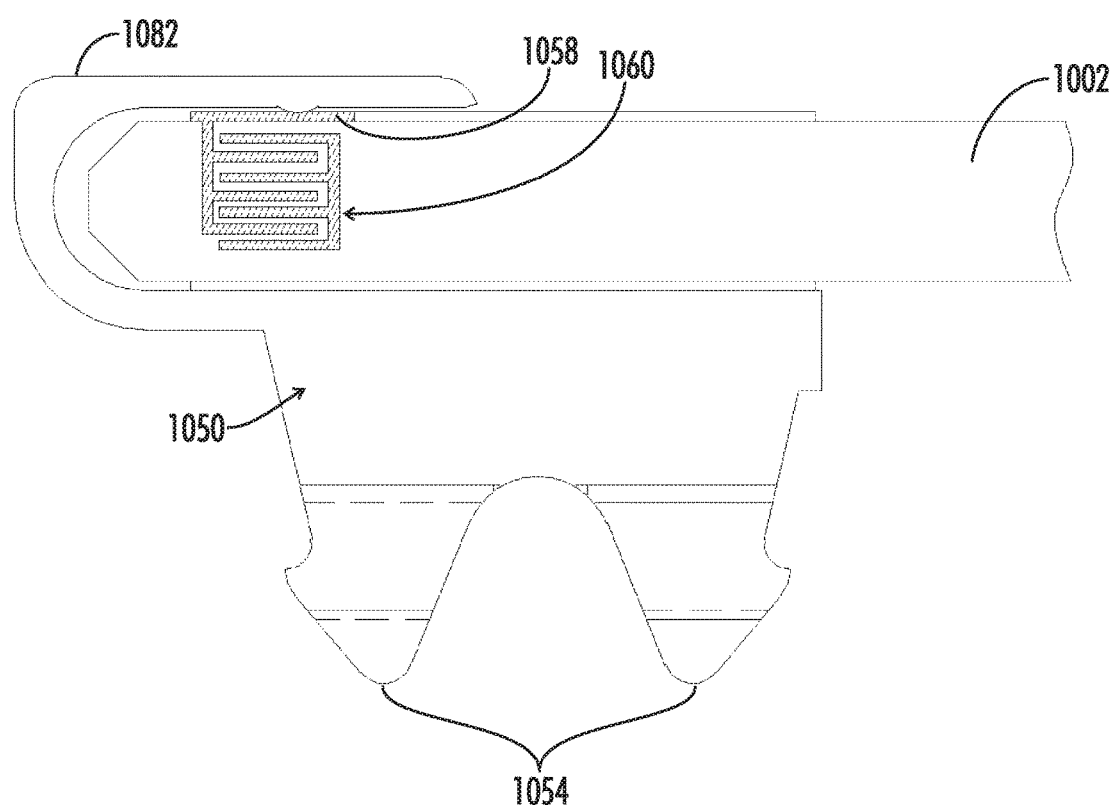
FIG. 51 is a detailed cross-section side elevation view of another further embodiment of the PCB and contacts assembly.

FIG. 51 shows yet another embodiment of the PCB 1002 including contact blades 1050. In this embodiment, only the contact blade 1050 is capacitively coupled to the capacitor, or otherwise stated electrically coupled to a first electrode 1058 which is set a distance from a second electrode 1060 disposed within the PCB, which further comprises a dielectric in the space between the electrodes to form the capacitor. A contact point 1082 of the contact blade 1050 is where the contact blade makes electrical contact with the corresponding female jack contact 12. The contact blade 1050 further includes insulation piercing protrusions 1054 for engaging a respective cable 114a. In certain variations of this embodiment, the top electrode 1058 may be optional.

Figure 52:
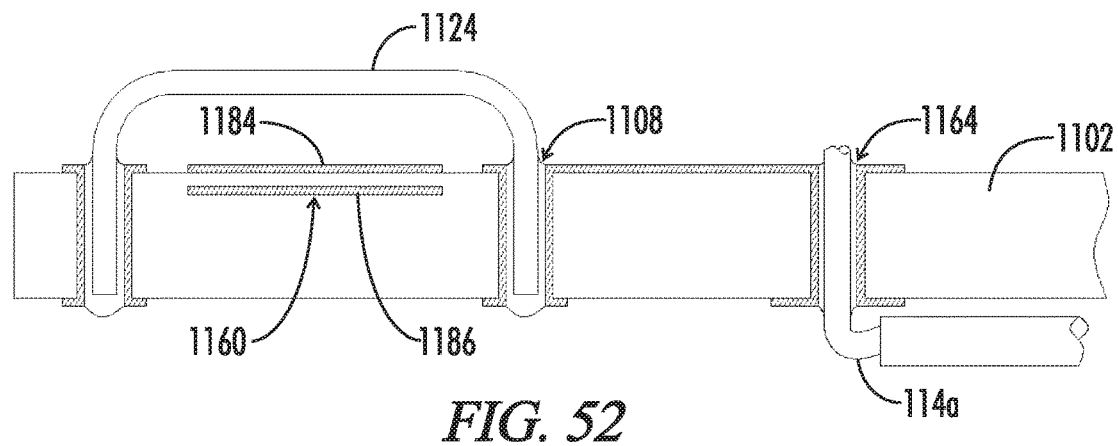
FIG. 52 is a detailed cross-section side elevation view of still another embodiment of the PCB and contacts assembly.
Figure 53:
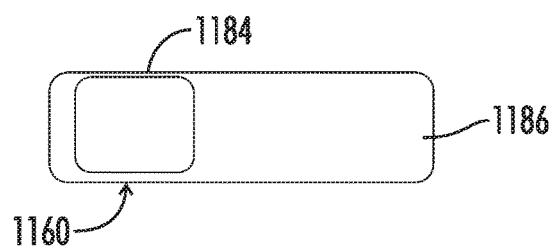
FIG. 53 is a top plan view of the capacitor plates of FIG. 52.

FIGS. 52-53 show still another embodiment of the PCB 1102 including plug contacts 1124. The PCB 1102 includes plated through holes 1108, 1164, each electrically connected to a respective plug contact 1124 and a cable 114a. The PCB 1102 further includes a capacitor 1160 including two plates 1184, 1186. The first plate 1184 is shorter than the second plate 1186 and is located under only one respective plug contact 1124. The second plate 1186 is located under two adjacent plug contacts 1124 and thus couples the adjacent contacts. A similar arrangement may be utilized for an adjacent pair of contacts. The contacts 1124 are mounted into the holes 1108 that are electrically connected to top electrodes 1158.

In such an embodiment, one of the capacitor plates is formed by the contact 1124 itself. The contact is separated from the capacitor plate on the PCB by air (thereby acting as the dielectric). Therefore, in an optional example of this embodiment, there may be no short plates 1184 provided.

Figure 54:
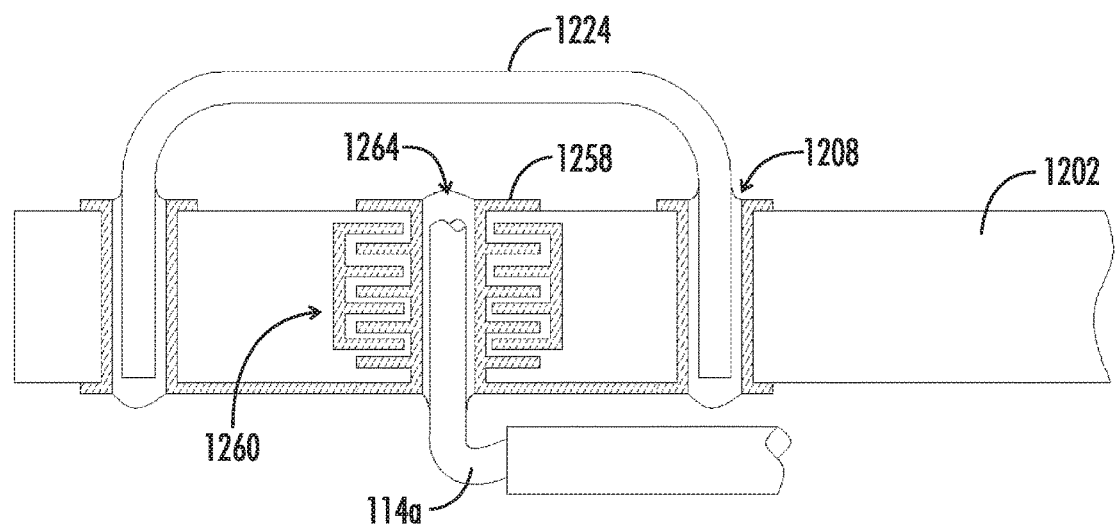
FIG. 54 is a cross-section side elevation view of a further still embodiment of the PCB and contacts assembly.

FIG. 54 illustrates yet another embodiment of the PCB 1202 including plug contacts 1224. Plated through holes 1208, 1264 in the PCB 1202 are each electrically connected to a respective contact 1224 and cable 114a by an electrode 1258. The multilayer capacitor 1260 is formed between the electrode 1258 of one respective plug contact 1224 and the electrode of an adjacent plug contact. The cable wire 114a is received in the plated through hole 1264 directly under the corresponding plug contact 1224.

Throughout the specification and claims, the following terms take at least the meanings explicitly associated herein, unless the context dictates otherwise. The meanings identified below do not necessarily limit the terms, but merely provide illustrative examples for the terms. The meaning of "a," "an," and "the" may include plural references, and the meaning of "in" may include "in" and "on." The phrase "in one embodiment," as used herein does not necessarily refer to the same embodiment, although it may.

The term "coupled" means at least either a direct electrical and/or mechanical connection between the connected items or an indirect connection through one or more passive or active intermediary devices.

Conditional language used herein, such as, among others, "can," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The previous detailed description has been provided for the purposes of illustration and description. Features or components from one embodiment may replace or add to features or components of another embodiment to form yet a further embodiment. Thus, although there have been described particular embodiments of a new invention, it is not intended that such references be construed as limitations upon the scope of the invention except as expressly set forth in the following claims.

What is claimed is:

1. A modular connector plug for forming a connector interface with a connector jack in a high speed data transmission network, the connector plug comprising:
   a printed circuit board (PCB) including a length defined from a contact end to a cable end opposite the contact end;
   at least a first cable pair comprising first and second cables and a second cable pair comprising third and fourth cables connected to the PCB; and
   a connector assembly including a first plug contact electrically coupled to the first cable, a fourth plug contact electrically coupled to the second cable, a second plug contact electrically coupled to the third cable, and a third plug contact electrically coupled to the fourth cable,
   wherein each of the plug contacts further comprises:
   a first end connected to the PCB, a second end, and
   a bridge portion having a length between the first end and the second end and having a width oriented perpendicular to the length and the first and second ends,
   wherein each bridge portion and second end of the respective plug contacts extends in parallel with each other and in transverse orientation with respect to the PCB length, further collectively defining a contact interface proximate the contact end, and
   a bridge portion of at least one of the plug contacts having a maximum width greater than the maximum width of a bridge portion of another plug contact, and
   wherein each plug contact defines an electrode of a compensating capacitance formed between adjacent pairs of plug contacts, each compensating capacitance defined at least partially by a distance between the respective adjacent pair of plug contacts at the contact interface.

2. The connector plug of claim 1, further comprising:
   a first compensating capacitance defined between the first and second plug contacts;
   a second compensating capacitance defined between the third and fourth plug contacts; and
   wherein the first and second compensating capacitances are defined to compensate for near end cross talk at the connector interface created by interaction of signals having signal frequencies in a data transmission bandwidth.

3. The connector plug of claim 1, wherein the PCB further comprises a plurality of through holes configured to receive the respective first ends of the plug contacts; and
    each plug contact is further configured wherein upon connecting the first end via a through hole of the PCB, the second end overhangs the contact end of the PCB.

4. The connector plug of claim 1, wherein each plug contact is approximately staple shaped.

5. The connector plug of claim 1, wherein each of the first and second ends for each plug contact are at least coincident with a lower plane of the PCB.

6. The connector plug of claim 1, wherein the at least one plug contact includes a protrusion extending from only one side of the plug contact in a direction towards an adjacent plug contact.

7. The connector plug of claim 1, further comprising an insulative material at least partially covering the plug contacts,
    wherein a first compensating capacitance is defined proximate the contact interface by the insulative material as between the first and second plug contacts,
    wherein a second compensating capacitance is defined by the insulative material as between the third and fourth plug contacts, and
    wherein the first and second compensating capacitances are defined to compensate for near end cross talk at the connector interface created by interaction of signals having signal frequencies in a data transmission bandwidth.

8. The connector plug of claim 1, wherein the PCB further comprises an air gap located between two adjacent conductor traces.

9. The connector plug of claim 8, further comprising:
    an insulative plug body having an interior configured to laterally receive the PCB and an exposed face portion corresponding to the contact interface when the PCB is received therein; and
    a conductive shield positioned corresponding with the air gap of the PCB when the PCB is received therein, the shield including a planar section extending in a direction transverse to a longitudinal axis of the air gap.

10. The connector plug of claim 9, wherein the conductive shield further comprises flanged portions extending from the planar section along a plane parallel to a surface of the PCB.

* * * * *